(12) United States Patent
Brillhart et al.

(10) Patent No.: US 8,034,180 B2
(45) Date of Patent: *Oct. 11, 2011

(54) METHOD OF COOLING A WAFER SUPPORT AT A UNIFORM TEMPERATURE IN A CAPACITIVELY COUPLED PLASMA REACTOR

(75) Inventors: Paul Lukas Brillhart, Pleasanton, CA (US); Richard Fovell, San Jose, CA (US); Douglas A. Buchberger, Jr., Livermore, CA (US); Douglas H. Burns, Saratoga, CA (US); Kallol Bera, San Jose, CA (US); Daniel J. Hoffman, Saratoga, CA (US)

(73) Assignees: Applied Materials, Inc., Santa Clara, CA (US); Advanced Thermal Sciences Corporation, Anaheim, CA (US)

( * ) Notice: Subject to any disclaimer, the term of this patent is extended or adjusted under 35 U.S.C. 154(b) by 599 days.

This patent is subject to a terminal disclaimer.

(21) Appl. No.: 11/410,782

(22) Filed: Apr. 24, 2006

(65) Prior Publication Data
US 2007/0097580 A1 May 3, 2007

Related U.S. Application Data

(60) Provisional application No. 60/725,763, filed on Oct. 11, 2005.

(51) Int. Cl.
C23C 16/00 (2006.01)
C23F 1/00 (2006.01)
H01L 21/306 (2006.01)
(52) U.S. Cl. .............. 118/724; 118/725; 156/345.27
(58) Field of Classification Search .............. 62/196.1; 156/345.27, 345.53, 345.56; 118/723, 723 ER, 118/324, 325
See application file for complete search history.

(56) References Cited

U.S. PATENT DOCUMENTS
2,707,868 A 5/1955 Goodman ..................... 62/4
(Continued)

FOREIGN PATENT DOCUMENTS
JP 63029220 A 2/1988
(Continued)

OTHER PUBLICATIONS

*Advanced Thermal Sciences Corporation v. Applied Materials, Inc.*, Civil Action No. SACV 07-1384 JVS (JWJx), "Complaint For Correction of Inventorship; Reformation And Declaration Of Contract Rights; Breach Of Contract And Declaration Of Inventorship and Demand For Jury Trial", filed Nov. 29, 2007.

(Continued)

*Primary Examiner* — Chen-Wen Jiang
(74) *Attorney, Agent, or Firm* — Knobbe Martens Olson & Bear LLP

(57) ABSTRACT

A method of controlling the temperature of a workpiece on a workpiece support in a plasma reactor includes placing coolant in a flow channel thermally coupled to the workpiece support, supporting a thermally conductive gas between the workpiece and the workpiece support to establish a backside gas pressure, providing sensors to measure the temperature of the workpiece support and the workpiece, and determining whether the rate of change in workpiece temperature is less or more than a rate limited by a thermal mass of the workpiece support. If the rate is less or equal, the thermal conditions of the coolant in the flow channel are changed to reduce a difference between the measured workpiece support temperature and a target workpiece support temperature. If the rate is more, the pressure of the thermally conductive gas is changed to reduce a difference between the measured workpiece temperature and a target workpiece temperature.

6 Claims, 11 Drawing Sheets

U.S. PATENT DOCUMENTS

| | | | |
|---|---|---|---|
| 3,826,304 A * | 7/1974 | Withers et al. ............... | 165/179 |
| 3,933,004 A | 1/1976 | Carter et al. .................. | 62/199 |
| 4,042,686 A | 8/1977 | Pommer et al. ............... | 424/705 |
| 4,313,783 A | 2/1982 | Davies et al. ................. | 438/716 |
| 4,384,918 A | 5/1983 | Abe ............................. | 216/71 |
| 4,705,951 A | 11/1987 | Layman et al. ............. | 250/442.11 |
| 4,752,141 A | 6/1988 | Sun et al. ..................... | 374/161 |
| 4,853,534 A | 8/1989 | Dakin ......................... | 250/227.17 |
| 4,883,354 A | 11/1989 | Sun et al. ..................... | 356/128 |
| 4,934,155 A | 6/1990 | Lowes .......................... | 62/197 |
| 5,057,968 A | 10/1991 | Morrison ..................... | 361/700 |
| 5,258,614 A | 11/1993 | Kidwell et al. .............. | 250/227.16 |
| 5,320,982 A * | 6/1994 | Tsubone et al. .............. | 438/714 |
| 5,410,889 A | 5/1995 | Sjoholm et al. .............. | 62/160 |
| 5,471,850 A | 12/1995 | Cowans ........................ | 62/223 |
| 5,549,756 A | 8/1996 | Sorensen et al. ............. | 118/715 |
| 5,551,249 A | 9/1996 | Van Steenburgh, Jr. ...... | 62/196.4 |
| 5,556,204 A | 9/1996 | Tamura et al. ................ | 374/161 |
| 5,567,267 A | 10/1996 | Kazama et al. .............. | 156/345.27 |
| 5,625,526 A | 4/1997 | Watanabe et al. ............ | 361/234 |
| 5,650,082 A | 7/1997 | Anderson ..................... | 219/390 |
| 5,701,758 A | 12/1997 | Haramoto et al. ............ | 62/503 |
| 5,742,022 A | 4/1998 | Crawford ..................... | 219/86.25 |
| 5,748,435 A | 5/1998 | Parkhe ......................... | 361/234 |
| 5,761,023 A | 6/1998 | Lue et al. ..................... | 361/234 |
| 5,762,009 A | 6/1998 | Garrison et al. ............. | 110/346 |
| 5,787,723 A | 8/1998 | Mueller et al. ............... | 62/347 |
| 5,815,396 A | 9/1998 | Shimamura et al. | |
| 5,878,583 A | 3/1999 | Schlosser et al. ............. | 62/73 |
| 5,886,866 A | 3/1999 | Hausmann ..................... | 361/234 |
| 5,888,907 A | 3/1999 | Tomoyasu et al. ............ | 438/714 |
| 5,970,731 A | 10/1999 | Hare et al. ..................... | 62/196.4 |
| 5,994,675 A | 11/1999 | Bethune et al. ............... | 219/483 |
| 6,015,465 A | 1/2000 | Kholodenko et al. ......... | 118/719 |
| 6,018,616 A | 1/2000 | Schaper ......................... | 392/418 |
| 6,033,482 A | 3/2000 | Parkhe ........................... | 118/728 |
| 6,066,824 A | 5/2000 | Crawford et al. ............. | 219/86.31 |
| 6,076,366 A | 6/2000 | Takano et al. ................ | 62/196.4 |
| 6,091,060 A * | 7/2000 | Getchel et al. ............... | 219/483 |
| 6,094,334 A | 7/2000 | Bedi et al. ..................... | 361/234 |
| 6,098,408 A | 8/2000 | Levinson et al. .............. | 62/3.2 |
| 6,125,025 A | 9/2000 | Howald et al. ............... | 361/234 |
| 6,135,052 A * | 10/2000 | Fujii et al. .................... | 118/723 E |
| 6,169,274 B1 | 1/2001 | Kulp .............................. | 219/497 |
| 6,174,408 B1 | 1/2001 | Kadomura et al. ........... | 156/345.27 |
| 6,196,553 B1 | 3/2001 | Eghabadi et al. ............. | 277/603 |
| 6,205,803 B1 | 3/2001 | Scaringe ........................ | 62/259.2 |
| 6,246,567 B1 | 6/2001 | Parkhe ........................... | 361/234 |
| 6,283,632 B1 | 9/2001 | Takaki ........................... | 374/161 |
| 6,318,384 B1 | 11/2001 | Khan et al. .................... | 134/22.1 |
| 6,320,736 B1 | 11/2001 | Shamouilian et al. ........ | 361/234 |
| 6,353,210 B1 | 3/2002 | Norrbakhsh et al. ......... | 219/497 |
| 6,397,629 B2 | 6/2002 | Wightman ...................... | 62/513 |
| 6,412,344 B1 | 7/2002 | Danicich et al. .............. | 73/290 V |
| 6,461,980 B1 | 10/2002 | Cheung et al. ................ | 438/765 |
| 6,468,384 B2 | 10/2002 | Singh et al. ................... | 156/345.27 |
| 6,481,886 B1 | 11/2002 | Narendrnath et al. ........ | 374/141 |
| 6,526,771 B2 | 3/2003 | Takano et al. ................. | 62/228.3 |
| 6,543,246 B2 | 4/2003 | Wayburn et al. .............. | 62/259.2 |
| 6,557,371 B1 * | 5/2003 | Judge ............................ | 62/468 |
| 6,564,563 B2 | 5/2003 | Goth et al. ..................... | 62/157 |
| 6,581,398 B2 | 6/2003 | Wightman ...................... | 62/222 |
| 6,583,980 B2 | 6/2003 | Wang et al. .................... | 361/234 |
| 6,623,596 B1 | 9/2003 | Collins et al. ................. | 156/345.48 |
| 6,645,871 B2 | 11/2003 | Tamura et al. ................ | 438/710 |
| 6,656,849 B2 | 12/2003 | Ogino et al. ................... | 48/714 |
| 6,664,048 B1 | 12/2003 | Wanker et al. ................ | 506/4 |
| 6,668,570 B2 | 12/2003 | Wall et al. ..................... | 62/223 |
| 6,681,580 B2 | 1/2004 | Shedivy et al. ................ | 62/73 |
| 6,705,095 B2 | 3/2004 | Thompson, Jr. et al. ....... | 62/117 |
| 6,709,715 B1 | 3/2004 | Lang et al. .................... | 427/489 |
| 6,740,853 B1 | 5/2004 | Johnson et al. ............... | 219/444.1 |
| 6,758,457 B2 | 7/2004 | Nicolino et al. .............. | 251/149.6 |
| 6,758,602 B2 | 7/2004 | Yamaguchi et al. .......... | 358/78 |
| 6,838,390 B2 | 1/2005 | Langley et al. ............... | 438/715 |
| 6,853,141 B2 | 2/2005 | Hoffman et al. ............. | 315/111.21 |
| 6,893,533 B2 | 5/2005 | Holland et al. ............... | 156/345.48 |
| 6,900,596 B2 | 5/2005 | Yang et al. ..................... | 315/111.21 |
| 6,946,053 B2 | 9/2005 | Donohoe ...................... | 156/345.44 |
| 6,993,922 B2 | 2/2006 | Wall et al. ..................... | 62/223 |
| 7,043,930 B2 | 5/2006 | Bussjager ...................... | 62/196.4 |
| 7,138,067 B2 | 11/2006 | Vahedi et al. .................. | 216/67 |
| 7,156,951 B1 | 1/2007 | Gao et al. ...................... | 156/345.53 |
| 7,178,353 B2 | 2/2007 | Cowans et al. ............... | 62/196.4 |
| 7,415,835 B2 | 8/2008 | Cowans et al. ............... | 62/190 |
| 2002/0000198 A1 | 1/2002 | Ishikawa et al. .............. | 118/715 |
| 2002/0014894 A1 | 2/2002 | Yonezawa et al. ............ | 324/760 |
| 2002/0108933 A1 | 8/2002 | Hoffman et al. ........ | 219/121.43 |
| 2002/0135969 A1 | 9/2002 | Weldon et al. ................ | 361/234 |
| 2002/0139477 A1 * | 10/2002 | Ni et al. ....................... | 156/345.44 |
| 2003/0228772 A1 | 12/2003 | Cowans ......................... | 438/795 |
| 2004/0040664 A1 | 3/2004 | Yang et al. | |
| 2004/0056602 A1 * | 3/2004 | Yang et al. .................... | 315/111.21 |
| 2004/0134769 A1 | 7/2004 | Wang et al. .................... | 204/192.17 |
| 2004/0173311 A1 | 9/2004 | Ichimaru et al. .............. | 156/345.27 |
| 2004/0258130 A1 | 12/2004 | Gotthold et al. | |
| 2005/0016471 A1 | 1/2005 | Chiang et al. ................. | 118/728 |
| 2005/0025500 A1 | 2/2005 | Hallemeier et al. .......... | 398/186 |
| 2005/0045104 A1 * | 3/2005 | Arai et al. ..................... | 118/724 |
| 2005/0155373 A1 * | 7/2005 | Hirooka et al. ................ | 62/498 |
| 2005/0230047 A1 * | 10/2005 | Collins et al. ................. | 156/345.33 |
| 2006/0076109 A1 | 4/2006 | Holland et al. ............... | 156/345.27 |
| 2007/0056512 A1 | 3/2007 | Hwang et al. ................. | 118/666 |
| 2007/0081294 A1 | 4/2007 | Buchberger, Jr. et al. .... | 361/234 |
| 2007/0081295 A1 | 4/2007 | Brillhart et al. ............... | 361/234 |
| 2007/0081296 A1 | 4/2007 | Brillhart et al. | |
| 2007/0089834 A1 | 4/2007 | Brillhart et al. .............. | 156/345.27 |
| 2007/0091537 A1 | 4/2007 | Buchberger, Jr. et al. .... | 361/234 |
| 2007/0091538 A1 | 4/2007 | Buchberger, Jr. et al. .... | 361/234 |
| 2007/0091539 A1 | 4/2007 | Buchberger , Jr. et al. .... | 361/234 |
| 2007/0091540 A1 | 4/2007 | Brillhart et al. ............... | 361/234 |
| 2007/0091541 A1 | 4/2007 | Buchberger, Jr. et al. .... | 361/234 |
| 2007/0095097 A1 | 5/2007 | Cowans et al. ............... | 62/196.4 |
| 2007/0102118 A1 | 5/2007 | Holland et al. ............... | 156/345.27 |
| 2007/0139856 A1 | 6/2007 | Holland et al. ............... | 361/234 |
| 2008/0225926 A1 | 9/2008 | Gotthold et al. .............. | 374/131 |
| 2010/0319851 A1 | 12/2010 | Buchberger et al. | |

FOREIGN PATENT DOCUMENTS

| | | | |
|---|---|---|---|
| JP | 05-144777 | | 6/1993 |
| JP | 05163096 A | | 6/1993 |
| JP | 06-331457 | | 12/1994 |
| JP | 2003-174016 | * | 6/2003 |
| JP | 2003-243492 | | 8/2003 |
| JP | 2005-085803 | | 3/2005 |
| JP | 2005-089864 | | 7/2005 |
| JP | 2005-527119 | | 9/2005 |
| JP | 2005-528790 | | 9/2005 |
| JP | 2001-358121 | | 12/2009 |
| WO | WO 03/100818 | | 12/2003 |
| WO | WO 03-103004 | | 12/2003 |
| WO | WO 2004025199 A1 | * | 3/2004 |

OTHER PUBLICATIONS

*Advanced Thermal Sciences Corporation v. Applied Materials, Inc.*, Case No. 8:07-CV-1384 (JVS) (JWJx), "Defendant Applied Materials, Inc.'s Answer To Plaintiff's Complaint, Affirmative Defenses And Amended Counterclaims and Demand For Jury Trial", filed Aug. 21, 2008.

*Advanced Thermal Sciences Corporation v. Applied Materials, Inc.*, Civil Action No. SAVC 07-1384 JVS (JWJx), "Supplemental Complaint For Fraud and Demand For Jury Trial", filed Oct. 21, 2008.

Official Action Dated Sep. 23, 2009 Issued in Co-Pending U.S. Appl. No. 11/408,558.

Official Action Dated Oct. 13, 2009 Issued in Co-Pending U.S. Appl. No. 11/509,184.

Official Action Dated Oct. 15, 2009 Issued in Co-Pending U.S. Appl. No. 11/409,292.

Official Action Dated Oct. 26, 2009 Issued in Co-Pending U.S. Appl. No. 11/409,326.

Official Action Dated Dec. 29, 2009 Issued in Co-Pending U.S. Appl. No. 11/409,183.

Official Action Dated Dec. 29, 2009 Issued in Co-Pending U.S. Appl. No. 11/408,567.

Official Action Dated Jan. 5, 2010 Issued in Co-Pending U.S. Appl. No. 11/408,333.
Official Action Dated Jan. 11, 2010 Issued in Co-Pending U.S. Appl. No. 11/408,558.
*Advanced Thermal Sciences Corporation* v. *Applied Materials, Inc.*, Civil Action No. SACV 07-1384 JVS (JWJx ), "Final Pretrial Conference Order", filed Oct. 28, 2009.
*Advanced Thermal Sciences Corporation* v. *Applied Materials, Inc.*, Civil Action No. SACV 07-1384 JVS (JWJx), "Advanced Thermal Sciences Corp.'s Post-Trial Brief in Response to Applied Materials, Inc.'s [Proposed] Findings of Fact and Conclusions of Law", filed Dec. 14, 2009.
*Advanced Thermal Sciences Corporation* v. *Applied Materials, Inc.*, Case No. 8:07-CV-1384 (JVS) (JWJ), "Applied Materials, Inc.'s Post Trial Brief", filed Dec. 14, 2009.
*Advanced Thermal Sciences Corporation* v. *Applied Materials, Inc.*, Case No. SACV07-01384-JVS (JWJx), "Civil Minutes—Trial", filed Dec. 22, 2009.
*Advanced Thermal Sciences Corporation* v. *Applied Materials, Inc.*, Case No. SACV07-01384-JVS (JWJx), "Findings of Fact and Conclusions of Law", filed May 18, 2010.
Official Action Dated Mar. 9, 2010 Issued in Co-Pending U.S. Appl. No. 11/409,292.
Official Action Dated Mar. 22, 2010 Issued in Co-Pending U.S. Appl. No. 11/408,333.
Official Action Dated Apr. 2, 2010 Issued in Co-Pending U.S. Appl. No. 11/410,869.
Official Action Dated May 5, 2010 Issued in Co-Pending U.S. Appl. No. 11/409,326.
*Advanced Thermal Sciences Corporation* v. *Applied Materials, Inc.*, Civil Action No. SACV 07-1384 JVS (JWJx), "Judgment", filed Jul 6, 2010.
*Advanced Thermal Sciences Corporation* v. *Applied Materials, Inc.*, Civil Action No. SACV 07-1384 JVS (JWJx), "Stipulated Order on Settlement", filed Jul. 23, 2010.
Official Action Dated Jun. 7, 2010 Issued in Co-Pending U.S. Appl. No. 11/410,859.
Official Action Dated Jun. 8, 2010 Issued in Co-Pending U.S. Appl. No. 11/409,326.
Official Action Dated Jun. 10, 2010 Issued in Co-Pending U.S. Appl. No. 11/408,559.
Official Action Dated Jun. 16, 2010 Issued in Co-Pending U.S. Appl. No. 11/409,184.
Official Action Dated Jun. 21, 2010 Issued in Co-Pending U.S. Appl. No. 11/408,558.
Official Action Dated Jul. 23, 2010 Issued in Co-Pending U.S. Appl. No. 11/409,292.
Japanese Official Action Nov. 24, 2009 in Japanese Application No. 2006-221559.
Japanese Official Action Nov. 24, 2009 in Japanese Application No. 2006-221560.
Katzenellenbogen, letter to Robert M. Wallace, Jul. 25, 2008.
Official Action Dated Jan. 4, 2011 in Co-Pending U.S. Appl. No. 11/408,333.
Official Action Dated Jan. 6, 2011 in Co-Pending U.S. Appl. No. 12/855,674.
Official Action Dated Jan. 25, 2010 in Co-Pending U.S. Appl. No. 11/409,184.
Official Action Dated Jan. 29, 2010 in Co-Pending U.S. Appl. No. 11/409,326.
Official Action Dated Mar. 8, 2011 in Co-Pending U.S. Appl. No. 11/408,558.
Official Action Dated Aug. 13, 2010 in Co-Pending U.S. Appl. No. 11/408,567.
Official Action Dated Aug. 20, 2010 in Co-Pending U.S. Appl. No. 11/409,183.
Official Action Dated Aug. 23, 2010 in Co-Pending U.S. Appl. No. 11/409,326.
Official Action Dated Sep. 7, 2010 in Co-Pending U.S. Appl. No. 11/409,184.
Official Action Dated Sep. 17, 2009 in Co-Pending U.S. Appl. No. 11/409,183.
Official Action Dated Sep. 28, 2009 in Co-Pending U.S. Appl. No. 11/410,859.
Official Action Dated Oct. 5, 2010 in Co-Pending U.S. Appl. No. 11/410,859.
Official Action Dated Dec. 4, 2009 in Co-Pending U.S. Appl. No. 11/409,183.
Official Action Dated Dec. 23, 2010 in Co-Pending U.S. Appl. No. 11/408,559.
Official Action Dated Dec. 29, 2010 in Co-Pending U.S. Appl. No. 11/409,292.

* cited by examiner

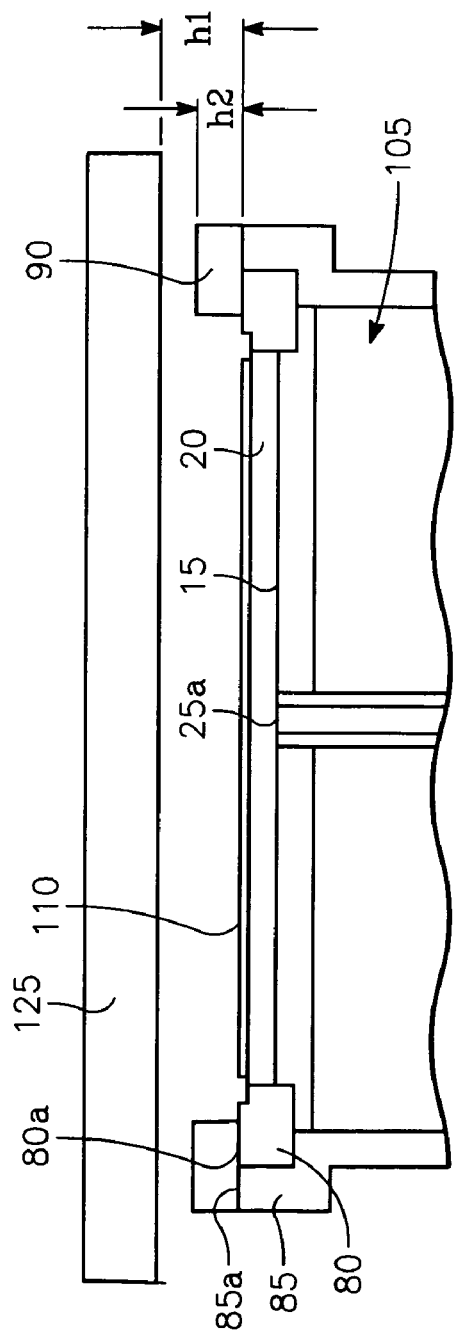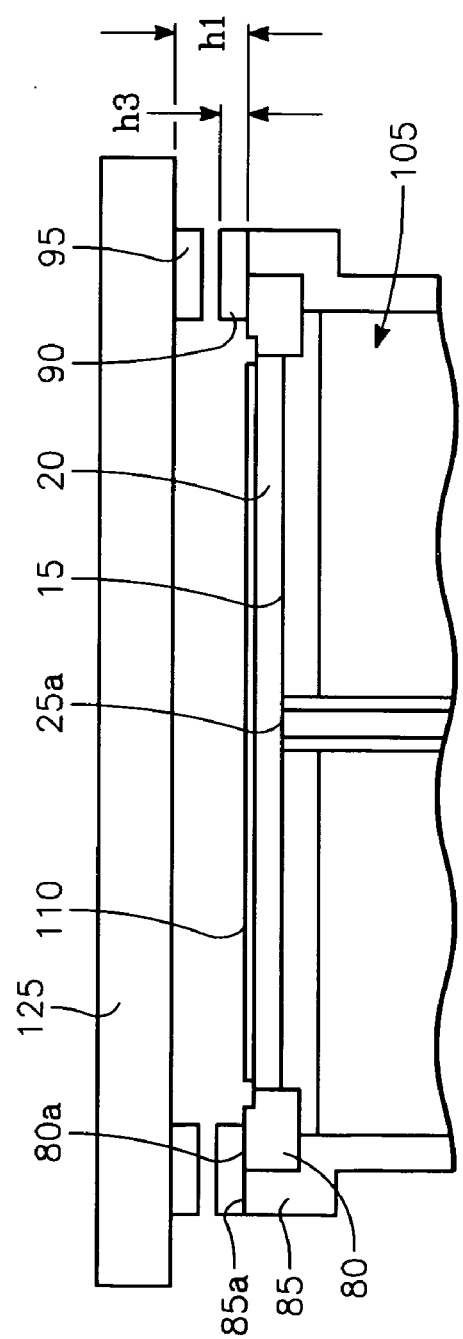

METHOD OF COOLING A WAFER SUPPORT AT A UNIFORM TEMPERATURE IN A CAPACITIVELY COUPLED PLASMA REACTOR

CROSS-REFERENCE TO RELATED APPLICATIONS

This application claims the benefit of U.S. Provisional Application No. 60/725,763, filed Oct. 11, 2005.

BACKGROUND OF THE INVENTION

In a capacitively coupled plasma reactor, control over dissociation has been achieved with a wide impedance match space at very high RF source power over a very wide chamber pressure range. Such a wide operating range is attributable, at least in part, to a unique feature of the overhead electrode matched to the RF power source by a fixed impedance matching stub with the following features. First, the electrode capacitance is matched to the plasma reactance at a plasma-electrode resonant frequency. The stub resonant frequency, the plasma-electrode resonant frequency and the source frequency are nearly matched at a VHF frequency. A highly uniform etch rate across the wafer is attained through a number of features. These features include, among other things, the adjustment of the bias power feedpoint impedance on the electrostatic chuck to provide a radially uniform RF impedance across the chuck for both its role as an RF bias power applicator and as an RF return for the VHF source power from the overhead electrode. This adjustment is made by dielectric sleeves around the bias feed line of uniquely selected dielectric constants and lengths. Another feature is a dielectric ring process kit for the cathode periphery to combat edge effects. Other features that can further improve process or etch rate distribution uniformity include dual zone gas feeding, curving of the overhead electrode and plasma steering magnetic fields. A plasma reactor that includes many of these key features provides an etch rate distribution uniformity that surpasses the conventional art.

With rapid shrinking of circuit feature sizes, the requirements for etch rate distribution uniformity are so stringent that small temperature variations across the wafer must now be minimized or eliminated, with the added proviso that future sophisticated process recipes designed to meet the latest stringent requirements will require agile and highly accurate time-changing wafer temperature profiling, and/or RF heat load profiling. Such changes must be effected or compensated with the greatest temperature uniformity across the wafer. How to do all this without degrading the now highly uniform etch rate distribution currently afforded by the reactor is a difficult problem. Moreover, such highly accurate and agile temperature control or profiling requires accurate temperature sensing at the wafer. However, introduction of temperature probes near the wafer will create parasitic RF fields which distort the fine effects of the feed-point impedance dielectric sleeves and the dielectric ring process kit, defeating their purpose. Temperature non-uniformities at the wafer arising from lack of control, to the extent that they impact the etch chemistry, will have the same ultimate effect of distorting an otherwise uniform environment.

Conventional cooling systems for regulating the temperature of the wafer support pedestal or electrostatic chuck employ a refrigeration system that cools a refrigerant or coolant medium using a conventional thermal cycle and transfers heat between the coolant and the electrostatic chuck through a separate liquid heat transfer medium. The coolant may be a mixture of deionized water with other substances such as glycol and (or) perfluoropolyethers. One problem with such systems is that, at high RF power levels (high RF bias power or high RF source power or both), such cooling systems allow the wafer temperature to drift (increase) for a significant period before stabilizing after the onset of RF power. Such temperature drift has two phases. In a brief initial phase, the electrostatic chuck is at an ambient (cold) temperature when RF power is first applied, so that the temperature of the first wafer to be introduced climbs rapidly toward equilibrium as the RF heat load slowly heats the chuck. This is undesirable because the wafer temperature rises uncontrollably during processing. Even after the electrostatic chuck (ESC) has been heated by the RF heat load, the wafer temperature drifts upwardly and slowly approaches an equilibrium temperature. Such drift represents a lack of control over wafer temperature, and degrades the process. The drift is caused by the inefficiency of the conventional cooling process.

Another problem is that rapid temperature variations between two temperature levels cannot be carried out for two reasons. First, the heat transfer fluid that provides thermal transfer between the ESC and the coolant has a heat propagation time that introduces a significant delay between the time a temperature change is initiated in the refrigeration loop and the time that the wafer actually experiences the temperature change. Secondly, there is a heat propagation time delay between the cooled portion of the ESC base and the wafer at the top of the ESC, this time delay being determined by the mass and heat capacity of the materials in the ESC.

One of the most difficult problems is that under high RF heat load on the wafer requiring high rates of thermal transfer through the cooled ESC, the thermal transfer fluid temperature changes significantly as it flows through the fluid passages within the ESC, so that temperature distribution across the ESC (and therefore across the wafer) becomes non-uniform. Such non-uniformities have not presented a significant problem under older design rules (larger semiconductor circuit feature sizes) because etch rate uniformity across the wafer diameter was not as critical at the earlier (larger) feature sizes/design rules. However, the current feature sizes have dictated the extremely uniform electric fields across the ESC achieved by the features described above (e.g., RF bias feed-point impedance adjustment, process kit dielectric edge rings). However, the high RF heat loads, dictated by some of the latest plasma etch process recipes, cause temperature non-uniformities across the wafer diameter (due to sensible heating of the thermal transfer fluid within the ESC) that distort an otherwise uniform etch rate distribution across the wafer. It has seemed that this problem cannot be avoided without limiting the RF power applied to the wafer. However, as etch rate uniformity requirements become more stringent in the future, further reduction in RF power limits to satisfy such requirements will produce more anemic process results, which will ultimately be unacceptable. Therefore, there is a need for a way of extracting heat from the wafer under high RF heat load conditions without introducing temperature non-uniformities across the ESC or across the wafer.

SUMMARY OF THE INVENTION

A method of transferring heat from or to a workpiece support in an RF coupled plasma reactor includes placing coolant in an internal flow channel that is located inside the workpiece support and transferring heat from or to the coolant by circulating the coolant through a refrigeration loop in which the internal flow channel of the workpiece support constitutes an evaporator of the refrigeration loop. The method further includes maintaining thermal conditions of the coolant inside the evaporator within a range in which heat exchange between the workpiece support and the coolant is primarily or exclusively through the latent heat of vaporization of the coolant.

BRIEF DESCRIPTION OF THE DRAWINGS

FIG. 5 illustrates a first dielectric ring process kit in the reactor of FIG. 1.

FIG. 6 illustrates a second dielectric ring process kit in the reactor of FIG. 1.

DETAILED DESCRIPTION OF THE INVENTION

Figure 1:
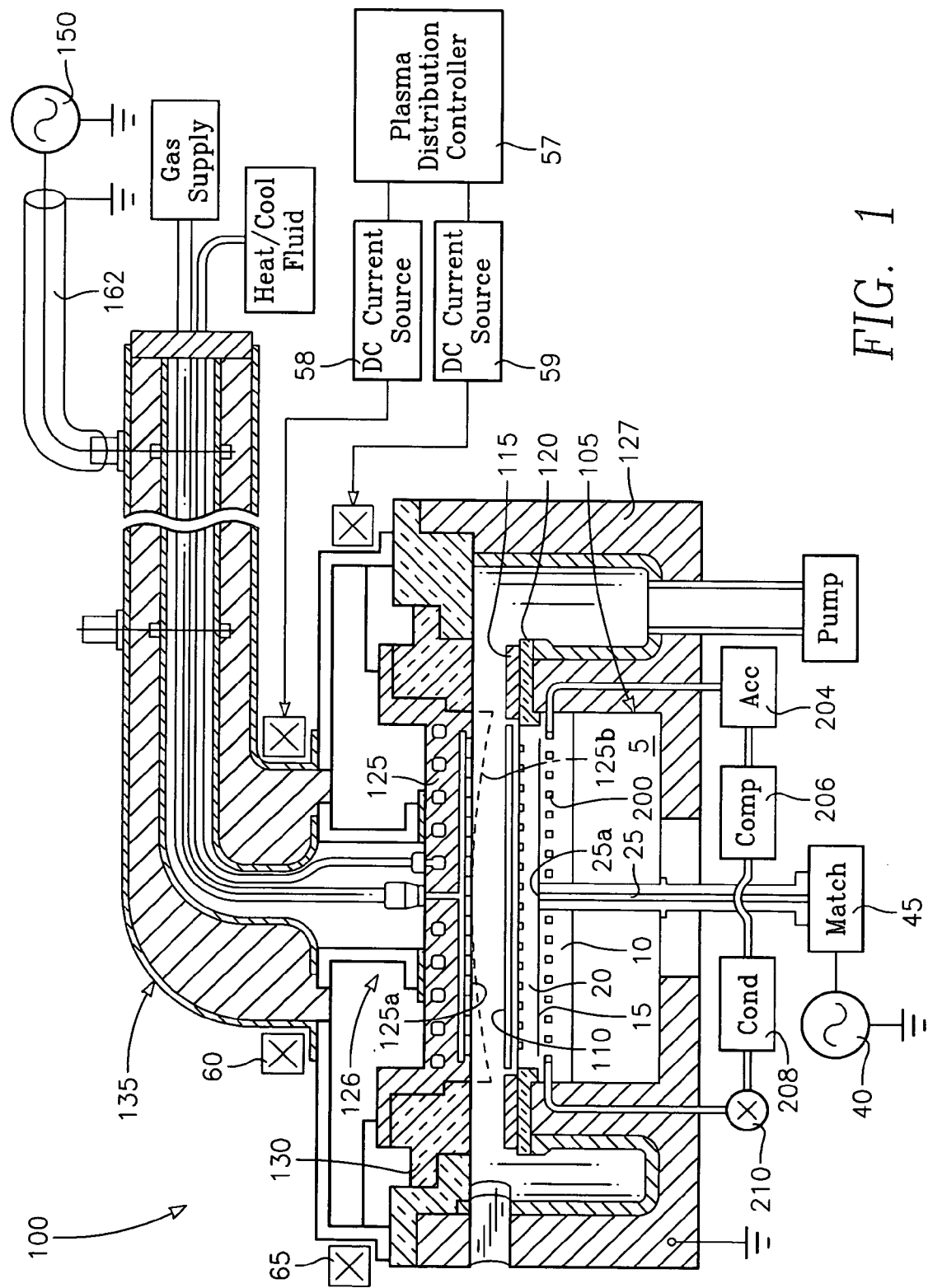
FIG. 1 illustrates a capacitively coupled plasma reactor embodying features of the invention.

Referring to FIG. 1, a plasma reactor includes a reactor chamber 100 with a wafer support 105 at the bottom of the chamber supporting a semiconductor wafer 110. A semiconductor ring 115 surrounds the wafer 110. The semiconductor ring 115 is supported on the grounded chamber body 127 by a dielectric (quartz) ring 120. The chamber 100 is bounded at the top by a disc shaped overhead electrode 125 supported at a predetermined gap length above the wafer 110 on grounded chamber body 127 by a dielectric (quartz) seal 130. An RF generator 150 applies RF plasma source power to the electrode 125. RF power from the generator 150 is coupled through a coaxial cable 162 matched to the generator 150 and into a coaxial stub 135 connected to the electrode 125. The stub 135 has a characteristic impedance, resonant frequency determined by its length, and provides an impedance match between the electrode 125 and the 50 Ohm coaxial cable 162 or the 50 Ohm output of the RF power generator 150. The chamber body is connected to the RF return (RF ground) of the RF generator 150. The RF path from the overhead electrode 125 to RF ground is affected by the capacitance of the semiconductor ring 115, the dielectric ring 120 and the dielectric seal 130. The wafer support 105, the wafer 110 and the semiconductor ring 115 provide the primary RF return path for RF power applied to the electrode 125.

A large impedance match space is realized when the source power frequency, the plasma electrode resonance frequency and the stub resonance frequency are nearly matched. Preferably, three frequencies are slightly offset from one another, with the source power frequency being 162 MHz (optimized for 300 mm wafers), the electrode-plasma resonant frequency being slightly below 162 MHz, and the stub resonance frequency being slightly above 162 MHz, in order to achieve a de-tuning effect which advantageously reduces the system Q. Such a reduction in system Q renders the reactor performance less susceptible to changes in conditions inside the chamber, so that the entire process is much more stable and can be carried out over a far wider process window.

The electrode capacitance is matched to the magnitude of the negative capacitance of the plasma, and the resulting electrode-plasma resonant frequency and the source power frequency are at least nearly matched. For the typical metal and dielectric etch process conditions (i.e., plasma density between $10^9$-$10^{12}$ ions/cc, a 2-inch gap and an electrode diameter on the order of roughly 12 inches), the match is possible if the source power frequency is a VHF frequency.

An advantage of choosing the capacitance of the electrode 125 in this manner, and then matching the resultant electrode-plasma resonant frequency and the source power frequency, is that resonance of the electrode and plasma near the source power frequency provides a wider impedance match and wider process window, and consequently much greater immunity to changes in process conditions, and therefore greater performance stability. Matching the stub resonance frequency to the electrode plasma resonant frequency minimizes reflections at the stub-electrode interface. The entire processing system is rendered less sensitive to variations in operating conditions, e.g., shifts in plasma impedance, and therefore more reliable along with a greater range of process applicability.

In accordance with a further aspect, the system Q is reduced to broaden the process window by slightly offsetting the stub resonant frequency, the electrode plasma resonant frequency and the plasma source power frequency from one another. The use of the higher VHF source power frequency proportionately decreases the Q as well. Decreasing system Q broadens the impedance match space of the system, so that its performance is not as susceptible to changes in plasma conditions or deviations from manufacturing tolerances.

Bias Circuit Tuning for Uniform Radial Plasma Distribution:

Continuing to refer to FIG. 1, the workpiece support cathode 105 includes a metal base layer 05 supporting a lower insulation layer 10, an electrically conductive mesh layer 15 overlying the lower insulation layer 10 and a thin top insulation layer 20 covering the conductive mesh layer 15. The semiconductor workpiece or wafer 110 is placed on top of the top insulation layer 20. RF bias power is coupled to the conductive mesh layer 15 to control ion bombardment energy at the surface of the wafer 110. The conductive mesh 15 also can be used for electrostatically chucking and de-chucking the wafer 110, and in such a case can be connected to a chucking voltage source in the well-known fashion. The conductive mesh 15 therefore is not necessarily grounded and can have, alternately, a floating electric potential or a fixed D.C. potential in accordance with conventional chucking and de-chucking operations. The metal base layer 05 typically (but not necessarily) is connected to ground, and forms part of a return path for VHF power radiated by the overhead electrode 125.

An RF bias generator 40 produces power in the HF band (e.g., 13.56 MHz). Its RF bias impedance match element 45 is coupled to the conductive mesh 15 by an elongate conductor 25 (hereinafter referred to as an RF conductor) extending through the workpiece support cathode 105. The RF conductor 25 is insulated from grounded conductors such as the aluminum base layer 05. The RF conductor 25 has a top termination or bias power feed point 25a in electrical contact with the conductive mesh 15.

Figure 2:
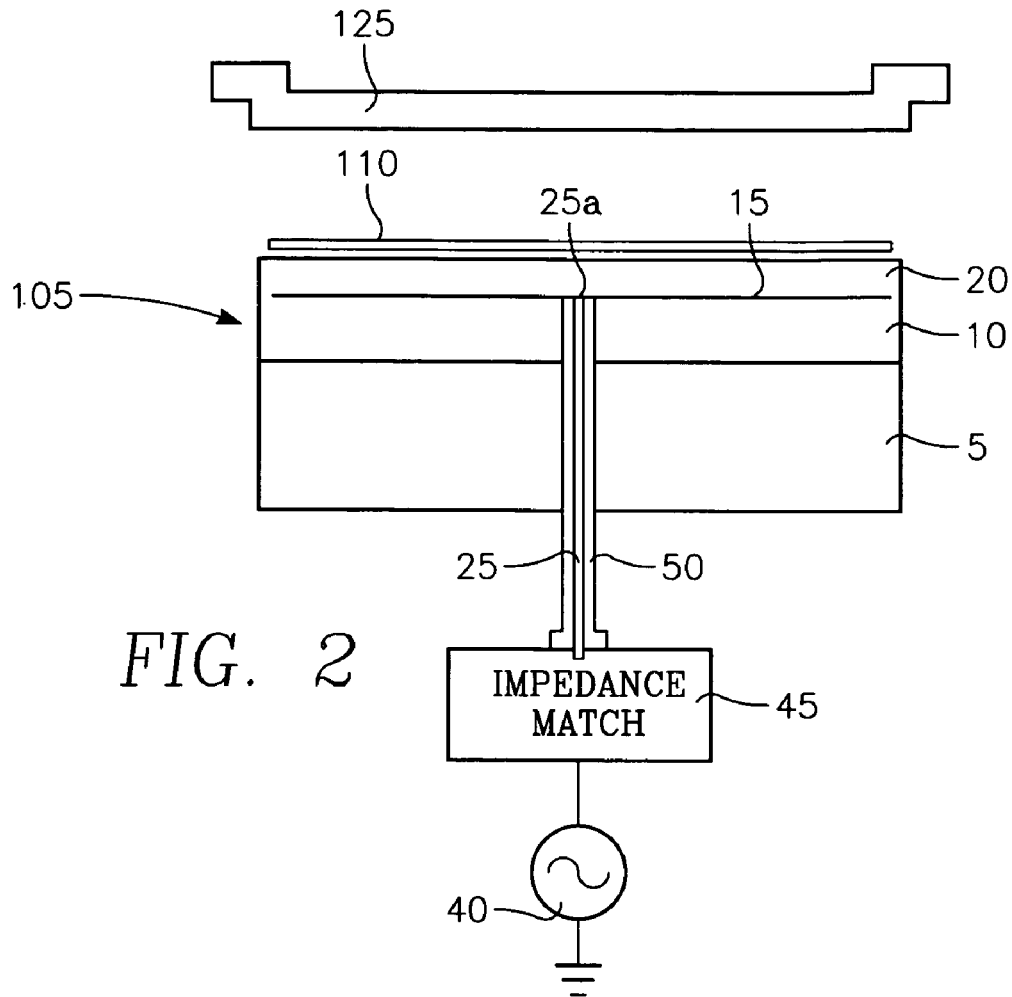
FIG. 2 is a schematic diagram of the RF bias power feed circuit of the reactor of FIG. 1.
Figure 3:
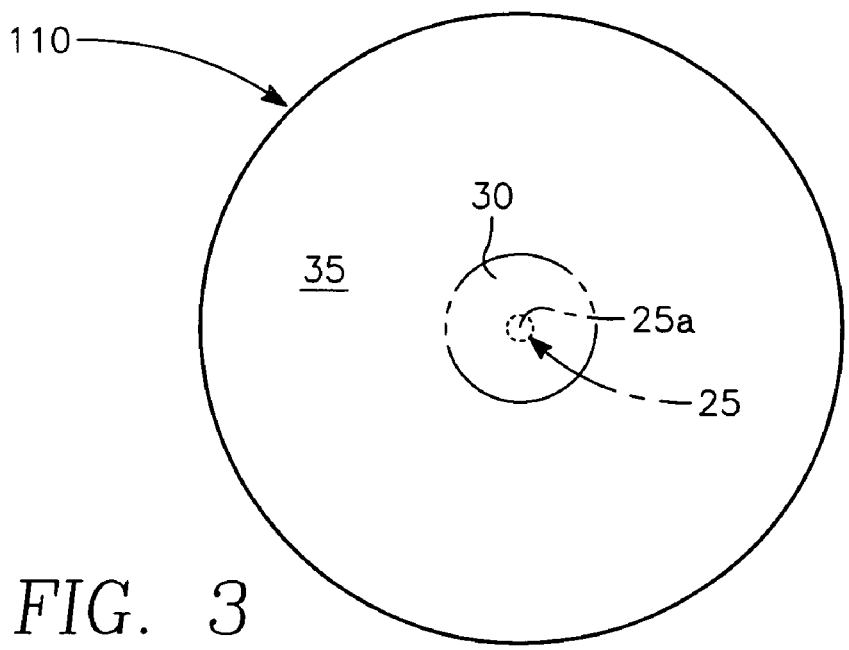
FIG. 3 is a top view corresponding to FIG. 2.

FIG. 2 is a schematic illustration corresponding to FIG. 1 of the circuit consisting of the VHF overhead electrode 125, the RF bias applied through the workpiece support cathode 105 and the elements of the cathode 105. FIG. 3 is a top plan view corresponding to FIG. 1 of the plane of the wafer 110, with the termination or feed point 25a of the RF conductor 25 being shown in hidden (dashed) line. The RF return path provided by the workpiece support cathode 105 consists of two portions in the plane of the wafer 110, namely a radially inner portion 30 centered about and extending outwardly from the feed point 25a and a radially outer annular portion 35. The RF return paths provided by the two portions 30, 35 are different, and therefore the two portions 30, 35 present different impedances to the VHF power radiated by the overhead electrode 125. Such differences may cause non-uniformities in radial distribution across the wafer surface of impedance to the VHF power, giving rise to nonuniform radial distribution of plasma ion density near the surface of the workpiece.

In order to solve this problem, a dielectric cylindrical sleeve 50 (shown in the enlarged view of FIG. 2) surrounds the RF conductor 25. The axial length and the dielectric constant of the material constituting the sleeve 50 determine the feed point impedance presented by the RF conductor 25 to the VHF power. In one example, the length and dielectric constant of the sleeve 50 is selected to bring the feed point impedance to nearly zero at the VHF source power frequency (e.g., 162 MHz). The impedance presented by the outer region 35 surrounding the feed point 25a is nearly a short at 162 MHz (due mainly to the presence of the conductive mesh 15). Therefore, in the latter example the sleeve 50 may bring the feed point impedance at the source power frequency to a value closer to that of the surrounding region. Here, the impedance of the region surrounding the feed point is determined mainly by the conductive mesh 15. As a result, a more uniform radial distribution of impedance is attained, for more uniform capacitive coupling of VHF source power.

The sleeve 50 can include additional features facilitating the foregoing improvement in VHF power deposition while simultaneously solving a separate problem, namely improving the uniformity in the electric field created by the RF bias power (at 13.56 MHz for example) applied to the wafer 110 by the RF conductor 25. The problem is how to adjust radial distribution of VHF power coupling for maximum uniformity of plasma ion density while simultaneously adjusting the HF bias power electric field distribution across the wafer surface for maximum uniformity.

Figure 4:
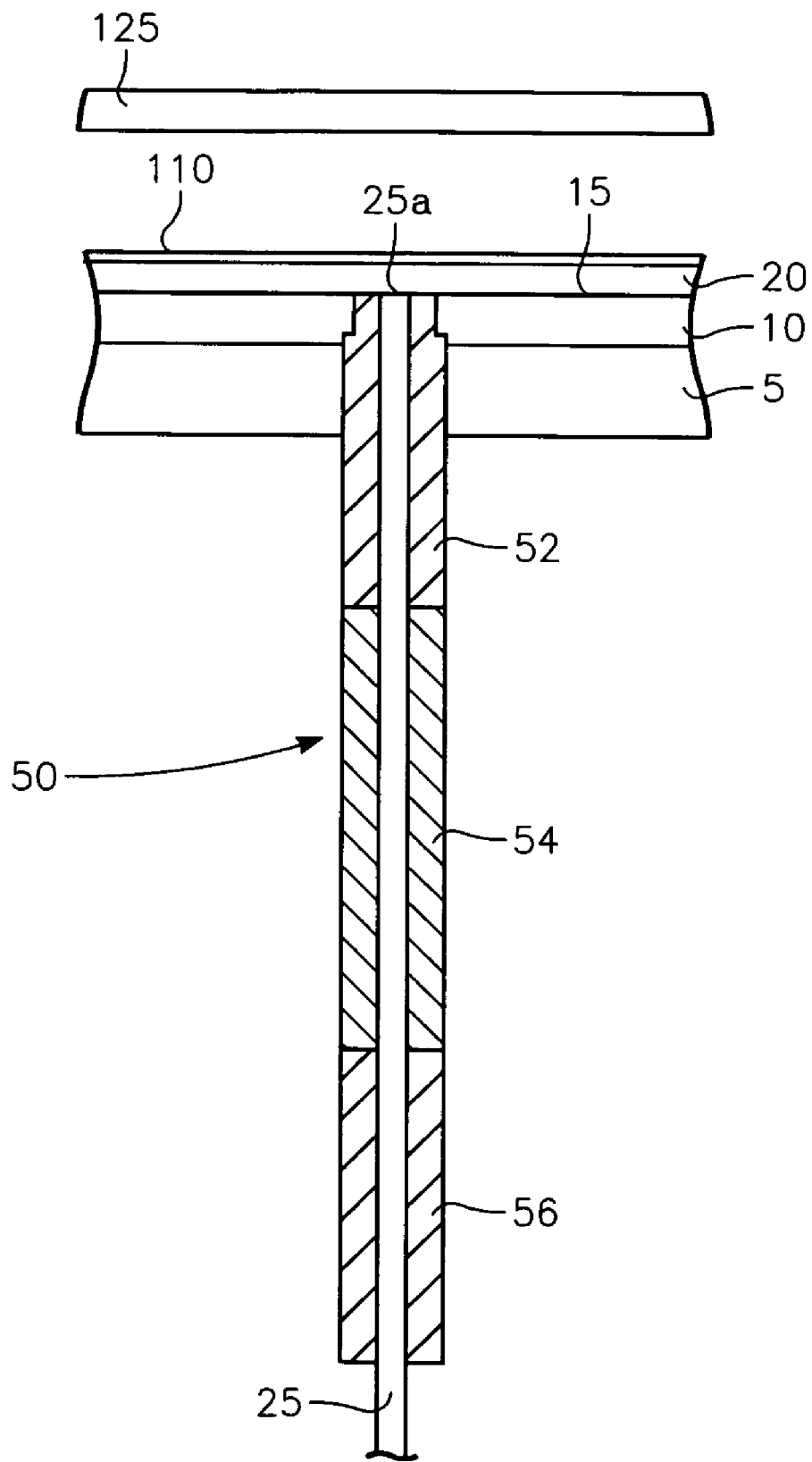
FIG. 4 is a detailed diagram of a coaxial feed portion of the circuit of FIG. 2.

FIG. 4 is an enlarged view corresponding to FIGS. 1-3 showing how the sleeve 50 can be divided into three sections, namely a top section 52, a middle section 54 and a bottom section 56. The length and dielectric constant of the sleeve top section 52 is selected and fixed to optimize the HF bias power deposition exclusively, and the lengths and dielectric constants of the remaining sleeve sections 54, 56 are then selected to optimize VHF source power deposition by the overhead electrode while leaving the HF bias power deposition optimized.

RF Coupling Ring for Enhancing Plasma Uniformity:

Center-high plasma distribution non-uniformity is reduced by selectively enhancing capacitive coupling from the overhead electrode 125 to the plasma in the vicinity of the workpiece periphery. FIG. 5 corresponds to an enlarged view of FIG. 1 illustrating the additional feature of an annular RF coupling ring that is placed over and in electrical contact with the outer periphery of the wafer support cathode 105. As shown in FIG. 5, the top insulation layer 20 is surrounded by a removable ring 80 whose top surface 80a is coplanar with the top surface of the wafer 110. The removable ring 80 can be formed of a process-compatible material such as silicon, for example. Optionally, removable metal ground ring 85 surrounds the removable ring 80, its top surface 85a being coplanar with that of the removable ring 80. A generally planar surface is provided across the top of the wafer support cathode 105 bounded by the periphery of the ground ring 85, facing the generally planar surface of the bottom of the overhead electrode 125. As a result, capacitive coupling across the entire processing zone bounded by the overhead electrode 125 and the wafer support cathode 105 is generally uniform. In order to overcome non-uniformity inherent in the center-high plasma ion density distribution of the reactor, capacitive coupling by the overhead electrode 125 is enhanced near the outer portion of the workpiece 110 by placing an RF coupling ring 90 over the removable ring 80 and over grounded ring 85. The RF coupling ring 90 may be a conductor, a semiconductor or a dielectric. If the coupling ring 90 is a dielectric, then capacitive coupling to the plasma near the wafer periphery is enhanced by the presence of the dielectric material. If the RF coupling ring 90 is a conductor, it in effect narrows the electrode-to-counterelectrode spacing and thereby enhances capacitance near the peripheral region of the wafer 110. Thus, the electrode-to-counterelectrode spacing is h1 everywhere in the process zone except at the periphery occupied by the RF coupling ring 90 where the spacing is reduced from h1 by the height h2 of the coupling ring 90. The increased capacitive coupling of source power enhances ion density at the periphery. The increase in ion density extends inwardly from the RF coupling ring 90 and extends over a peripheral portion of the workpiece 110. Thus, the plasma ion density over the workpiece 110 is less center high and may tend toward being more nearly uniform, or possibly slightly edge-high. This condition is optimized by a careful selection of the height (thickness) h2 of the RF coupling ring 90.

FIG. 6 illustrates a modification of the reactor of FIG. 5 in which a second RF coupling ceiling ring 95 is attached to the periphery of the bottom surface of the overhead electrode 125 and overlies the first RF coupling ring 90. If each ring 90, 95 has a thickness (height) of h3, then the electrode-to-counterelectrode distance near the wafer periphery is reduced by twice h3 and the capacitance in that region is enhanced proportionately, as in the reactor of FIG. 5.

With the RF coupling ring 90 and the dielectric sleeve 50, plasma ion density distribution uniformity is improved. Any remaining non-uniformities can be corrected by plasma-steering magnetic fields controlled by a plasma distribution controller 57 (shown in FIG. 1) governing D.C. current sources 58, 59 that drive overhead coils 60, 65.

Another modification that can be employed to enhance plasma processing uniformity across the diameter of the wafer 110 is to change the planar electrode surface 125a to a convex curved electrode surface 125b. The degree of curvature can be selected to compensate for non-uniform plasma ion density radial distribution that may exist with the planar electrode surface 125a.

Figure 7:
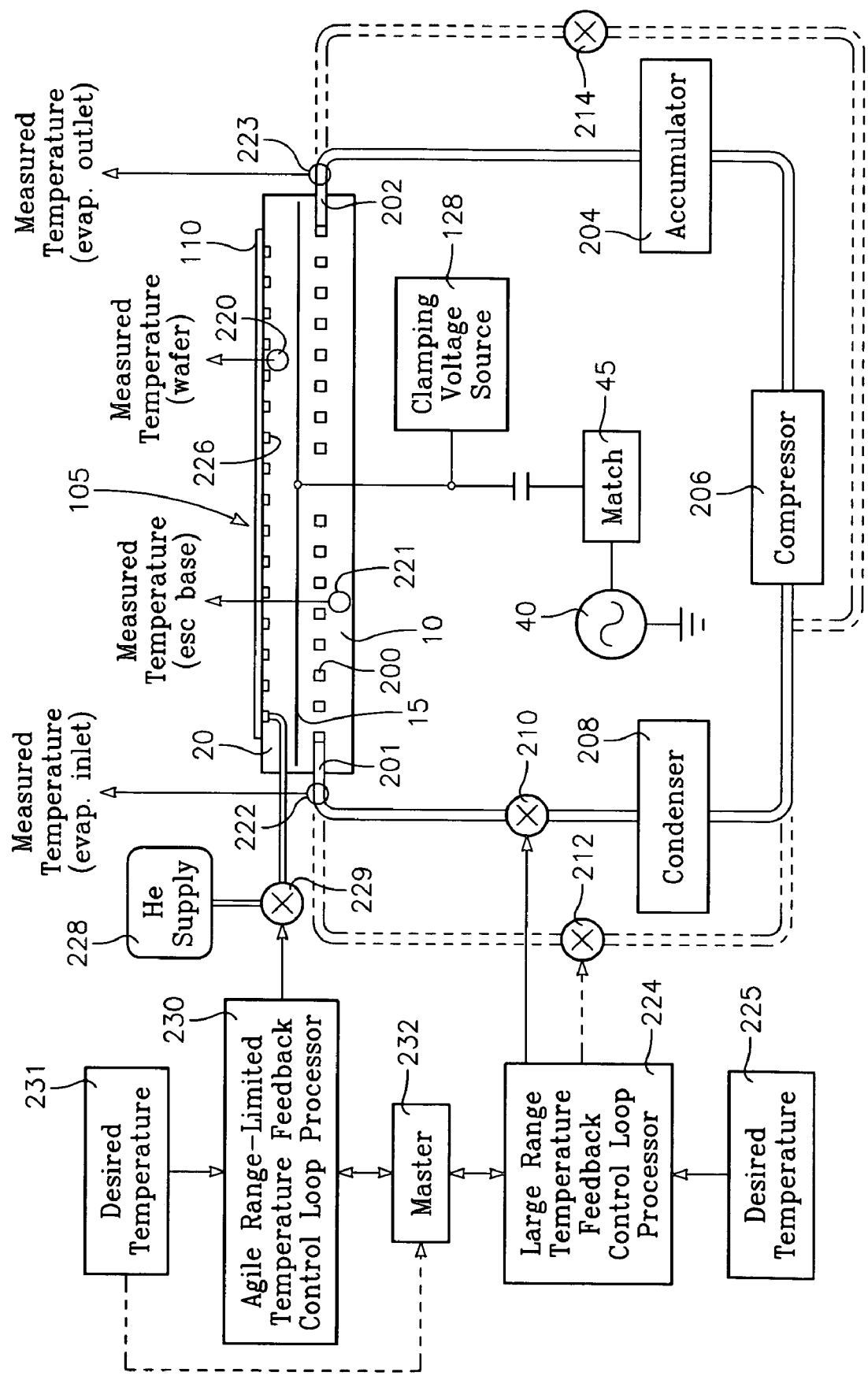
FIG. 7 illustrates a system including the reactor of FIG. 1 embodying the invention.

Highly Efficient Temperature Control Apparatus:

FIG. 7 is an enlarged view of the wafer support pedestal 105 of FIG. 1, revealing the internal structure of the pedestal 105. The pedestal 105 embodies an electrostatic chuck (ESC), as described in FIG. 2, FIG. 7 showing that the aluminum base 5 contains flow passages 200 for a PCHT medium with an inlet 201 and an outlet 202. The internal flow passages 200 constitute the heat exchanger of a PCHT loop, the heat exchanger 200 being internally contained with the ESC base 5. The PCHT loop can operate in either of two modes, namely a cooling mode (in which the heat exchanger 200 functions as an evaporator) and a heating mode (in which the heat exchanger 200 functions as a condenser). The remaining elements of the PCHT loop are external of the ESC 105, and include (in order of PCHT medium flow direction, starting from the outlet 202) an accumulator 204, a compressor 206 (for pumping the PCHT medium through the loop), and (for the cooling mode of operation) a condenser 208 and an expansion valve 210 having a variable orifice size, all of which are of the type well-known in the art. An advantage of locating the heat exchanger 200 inside the ESC base 05 is that the delay and losses inherent in the thermal transfer fluid of the prior art are eliminated. The PCHT loop (i.e., the heat exchanger 200, the accumulator 204, the compressor 206, the condenser 208, the expansion valve 210 and the conduits coupling them together, contain the PCHT medium (which functions as a refrigerant or coolant when the PCHT operates in the cooling mode) of a conventional type and can have low electrical conductivity to avoid interfering with the RF characteristics of the reactor. The accumulator 204 prevents any liquid form of the PCHT medium from reaching the compressor 206 by storing the liquid. This liquid is converted to vapor by appropriately operating the bypass valve 214.

In order to overcome the problem of thermal drift during processing, the efficiency of the PCHT loop is increased ten-fold or more by operating the PCHT loop 200, 204, 206, 208, 210 so that the PCHT medium inside the heat exchanger is divided between a liquid phase and a vapor phase. The liquid-to-vapor ratio at the inlet 201 is sufficiently high to allow for a decrease in this ratio at the outlet 202. This guarantees that all (or nearly all) heat transfer between the ESC base 05 and the PCHT medium (coolant) within the heat exchanger (evaporator) 200 occurs through contribution to the latent heat of evaporation of the PCHT medium. As a result, the heat flow in the PCHT loop exceeds, by a factor of 10, the heat flow in a single-phase cooling cycle. This condition can be satisfied with a decrease in the CPHT medium's liquid-to-vapor ratio from the inlet 201 to the outlet 202 that is sufficiently limited so that at least a very small amount of liquid remains at (or just before) the outlet 202. In the cooling mode, this requires that the coolant capacity of the PCHT loop is not exceeded by the RF heat load on the wafer. One way of ensuring this is to provide the PCHT loop with a maximum cooling capacity that is about twice the maximum anticipated heat load on the wafer. In one implementation of a reactor of the type depicted in FIGS. 1-7, the maximum cooling rate of the PCHT loop was between about three and four times the maximum anticipated heat load on the wafer. The heat load on the wafer was about 30% of the applied RF power on the wafer. The liquid-to-vapor ratio was between about 40% and 60% at the inlet 201 and about 10% at the outlet 202.

While the PCHT loop has been described with reference primarily to the cooling mode of operation, it can also be employed in a heating mode whenever it is desired to raise the temperature of the ESC (e.g., at a faster rate than plasma heating alone is capable of). For operation of the PCHT loop in the heating mode, the condenser 206 and expansion valve 210 are bypassed by at least some of the PCHT medium by opening the bypass valve 212, so as to allow superheated PCHT medium to flow to the heat exchanger 200. In this case, the heat exchanger 200 functions as a condenser rather than an evaporator. In this mode (the heating mode), overheating of the compressor 206 may be prevented by providing an additional bypass (not shown) from the output of the condenser 206 to the input of the compressor 208. In the heating mode, the liquid-to-vapor ratio in the heat exchanger 200 may be zero.

Figure 8:
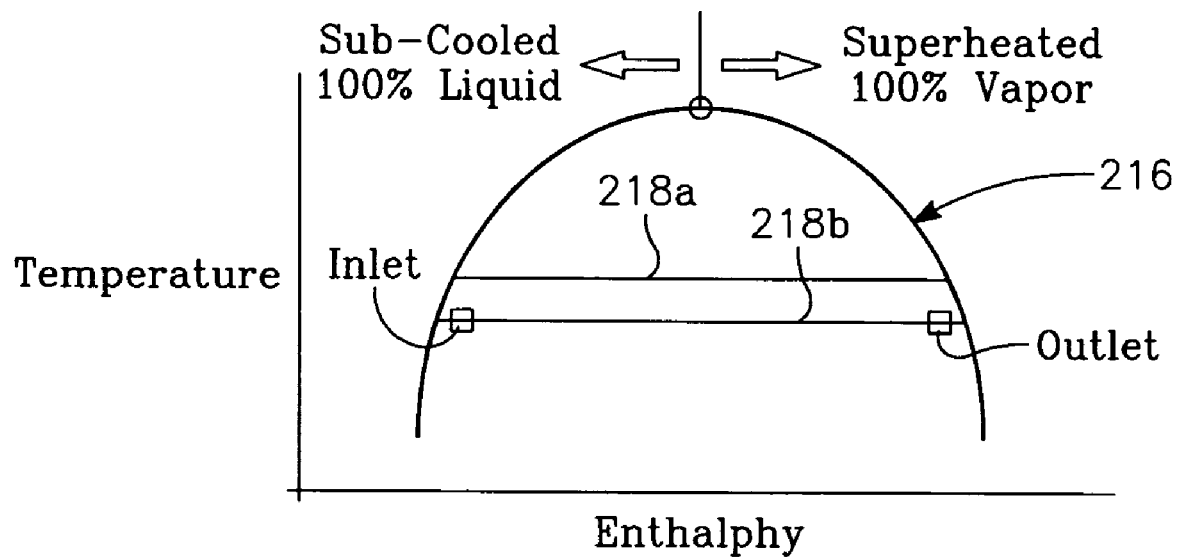
FIG. 8 is a graph of the temperature as a function of enthalpy of the coolant inside the evaporator of FIG. 7, and further depicting the dome-shaped liquid-vapor phase boundary.

FIG. 8 is a phase diagram depicting the enthalpy of the PCHT medium inside the heat exchanger 200 as a function of temperature. The temperature-enthalpy boundary between the three phases (liquid, solid, vapor) is a liquid-vapor dome 216 beneath which the PCHT medium exists in both liquid and vapor phases. To the lower enthalpy side of the dome 216, the PCHT medium is a sub-cooled (100%) liquid phase while to the higher enthalpy side of the dome 216 the PCHT medium is a superheated (100%) vapor. At the apex of the dome is the triple point at which all three phases of the PCHT medium are present simultaneously. The controllable parameters of the PCHT loop of FIG. 7, (i.e., the PCHT medium flow rate established by the compressor 206, the orifice size of the expansion valve 210 and the opening size of a bypass valve 212 that will be discussed later herein) are selected by the skilled worker so that the temperature and enthalpy of the PCHT medium inside the heat exchanger 200 stays under or within the liquid-vapor dome 216 of the phase diagram of FIG. 8. The pressure inside the heat exchanger 200 is maintained at a constant level provided that a constant ESC base temperature is desired, so that there is theoretically no temperature change as the coolant flows through the heat exchanger 200, as indicated by the perfectly horizontal lines of constant pressure 218a, 218b of FIG. 8. (In actual practice, there is a negligible temperature difference across the ESC inlet and outlet 201, 202 of about 5 degrees C or less under typical operating conditions.) As the PCHT medium inside the evaporator 200 absorbs heat from the ESC base 5, its internal energy U increases, causing its enthalpy to increase (where enthalpy is U+PV, P and V being pressure and volume inside the evaporator 200). To satisfy the requirement for two-phase heat transfer through latent heat of evaporation exclusively (or nearly exclusively) as defined above, the PCHT medium's enthalpy/temperature coordinates must remain inside the liquid-vapor dome 216 of FIG. 8. Thus, for a constant pressure, the PCHT medium's temperature/enthalpy coordinates follow a line of constant pressure (e.g., line 218a) entering the heat exchanger 200 at a low enthalpy (labeled "inlet" in FIG. 8) and exiting at a higher enthalpy (labeled "outlet" in FIG. 8), with the entry and exit enthalpies lying inside or on the boundary of the liquid-vapor dome 216. FIG. 8 shows that a greater increase in enthalpy (absorbed heat) is achieved at lower coolant temperatures.

Solution to the Problem of Non-Uniform Temperatures Across the ESC and Wafer:

Maintaining the PCHT medium (hereinafter referred to as "coolant") inside the evaporator 200 of FIG. 7 within the liquid-vapor dome of FIG. 8—to guarantee heat extraction through the latent heat of vaporization almost exclusively—solves the problem of non-uniform temperature across the wafer under high RF heat loads. This is because heat transfer via the latent heat of vaporization is a constant-temperature process. In the cooling mode of the PCHT loop, as it absorbs heat, the coolant inside the evaporator 200 does not change temperature. Instead, it changes phase, going from liquid to vapor. Thus, all the coolant throughout the evaporator 200 (the fluid passages inside the ESC base 5) is at a uniform temperature regardless of the magnitude of the RF heat load on the wafer. The advantage is that the wafer temperature distribution is about as uniform as the electric field distribution across the ESC, so that the etch rate uniformity achieved under the most favorable conditions by the electrical features discussed earlier herein (e.g., the RF bias feedpoint impedance adjustment by multiple dielectric sleeves and the dielectric edge ring process kit) is maintained even under the highest RF heat loads, a result heretofore unattainable. This result renders the reactor of FIGS. 1-7 useful for plasma processing under the current design rules (small feature sizes) and for several generations of future design rules in which feature sizes may shrink even further, a significant advantage. This advantage is combined with the extremely high heat capacity of cooling through latent heat of vaporization (discussed above), which provides about an order of magnitude greater heat flow rate than conventional (sensible) heat transfer via the coolant mass heat capacity.

Figure 9:
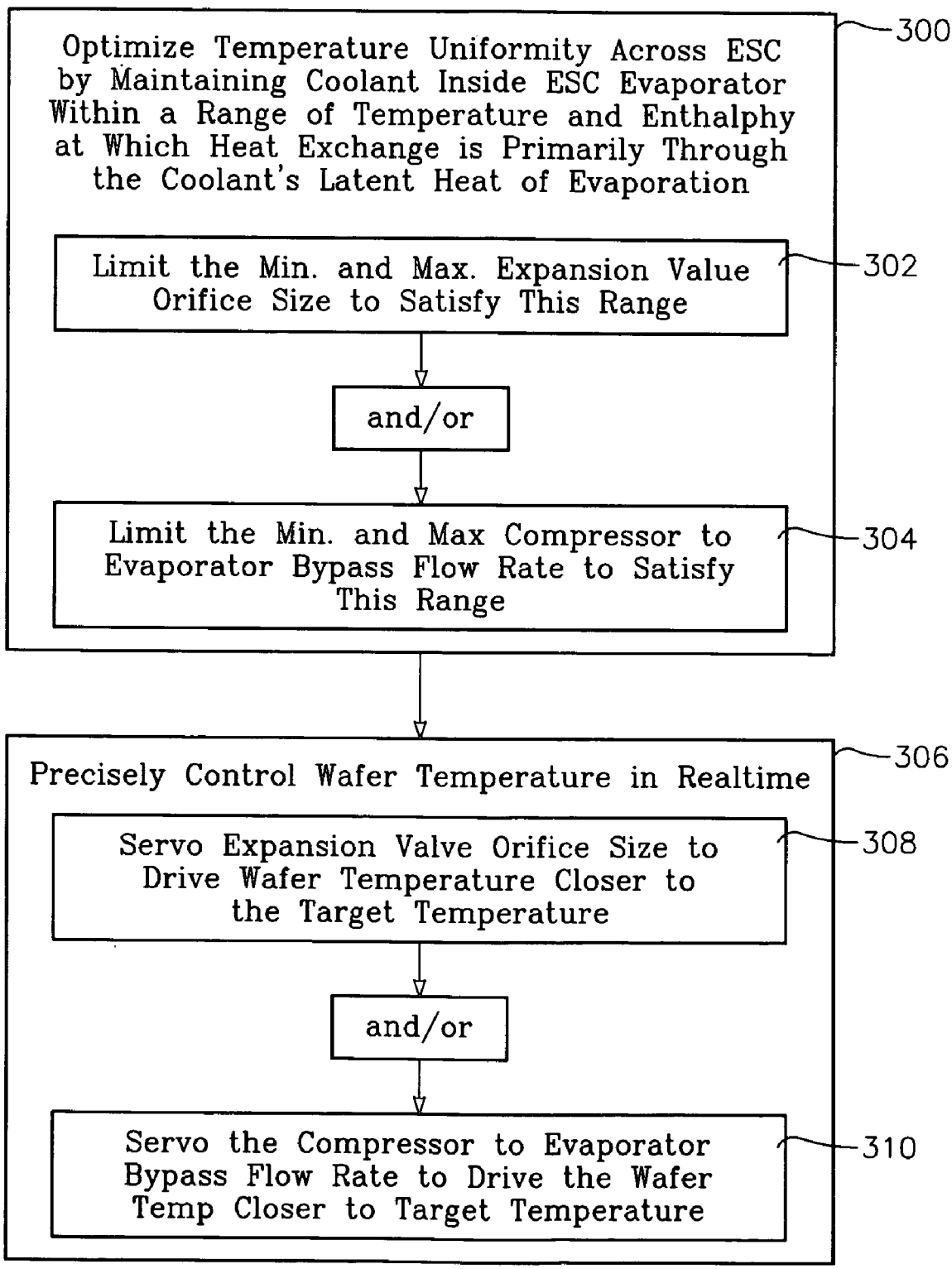
FIG. 9 is a block flow diagram of a two-phase constant temperature cooling process of the invention.

Operation of the reactor of FIG. 7 in the foregoing manner that results in heat transfer through the coolant's latent heat of vaporization corresponds to the method illustrated in FIG. 9. The first step in this method is to enhance or optimize uniformity of radial distribution of the ESC temperature by maintaining the coolant that is inside the evaporator 200 within a range of temperatures and enthalpies at which the heat transfer is through contributions to (or deductions from) the coolant's latent heat of vaporization. This step is depicted in block 300 of FIG. 9. The step of block 300 may be carried out by limiting variation in the orifice or opening size of the expansion valve 210 to a range which confines the temperature and enthalpy of the coolant in the evaporator 200 to lie inside the liquid-vapor dome 216 of the temperature-enthalpy diagram of FIG. 8 (block 302 of FIG. 9). For a given coolant and for a given coolant flow rate, the adjustment range of the expansion valve that confines the coolant inside the liquid-vapor dome 216 of FIG. 8 is readily determined and can be pre-programmed into a microprocessor controlling the entire system, for example. The step of block 300 may also be carried out by adjusting the compressor-to-evaporator bypass flow valve 212 within a range in which the coolant inside the evaporator 200 is maintained inside the liquid-vapor dome 216 of FIG. 8 (block 304 of FIG. 9). The adjustment of the bypass valve 212 (in the step of block 304) and the adjustment of the expansion valve 210 (in the step of block 302) may be combined to achieve the desired result.

Once heat transfer through the latent heat of vaporization in the evaporator 200 has been established by the step of block 300, the next step is to control the ESC temperature (block 306 of FIG. 9). This may be accomplished by adjusting the expansion valve 210 within the range established in the step of block 300 until a desired ESC temperature is reached (block 308 of FIG. 9). Alternatively, the ESC temperature may be controlled by adjusting the compressor-to-evaporator bypass valve 212 within the range established in the step of block 304. This latter step corresponds to block 310 of FIG. 9. Temperature control may also be carried out by performing the steps of blocks 308 and 310 together.

WORKING EXAMPLE

While the variable orifice size of the expansion valve 210 is the primary control over cooling rate and wafer temperature, additional or alternative temperature control and, if desired, heating of the wafer, is provided by a compressor-to-evaporator bypass valve 212. Complete conversion of all liquid coolant to the gas phase in the accumulator 204 can be ensured using a compressor-to-accumulator bypass valve 214.

While selection is readily made of a suitable coolant, a flow rate by the compressor 206 and an orifice size of the expansion valve that satisfies the foregoing conditions, the following is provided as a working example in which two-phase cooling is achieved:

ESC Inlet temperature: −10 to +50 deg C.
ESC Inlet pressure: 160 to 200 PSIG
ESC Inlet liquid-vapor ratio: 40%-60% liquid
ESC Inlet-Outlet max temperature difference: 5 deg C.
ESC Inlet-Outlet max pressure difference: 10 PSI
ESC Outlet Liquid-vapor ratio: 10% liquid
Accumulator outlet temperature: 60 to 80 deg C.
Accumulator outlet pressure: 25 to 35 PSIG
Accumulator outlet liquid-vapor ratio: 100% vapor
Compressor flow rate: 4 gal per min
Compressor outlet pressure: 260-270 PSIG
Compressor outlet temperature: 80-100 deg C.
Compressor outlet liquid-vapor ratio: 100% vapor
Condenser outlet temperature: 20-40 deg C.
Condenser outlet pressure: 250 PSIG
Condenser liquid-vapor ratio: 100% vapor
Expansion valve outlet liquid-vapor ratio: 80%

Some evaporation occurs between the expansion valve outlet and the ESC coolant inlet 201, which explains the decrease in liquid-vapor ratio from 80% to 60% from the expansion valve 210 to the ESC inlet 201. While it may be preferable to constrain the thermal cycle within the liquid-vapor dome 216 of FIG. 8 (as discussed above), the invention may be implemented with some excursion beyond that limit. In particular, the coolant's liquid-vapor ratio may at least nearly reach zero at the evaporator outlet 202, or may reach zero just before the evaporator outlet 202, in which case a small amount of sensible heating may occur. In such a case, the vast majority of heat transfer still occurs through the latent heat of vaporization, only a small fraction occurring through sensible heating, so that the advantages of the invention are realized nonetheless.

Large Range Temperature Feedback Control Loop:

Referring again to FIGS. 1 and 7, the wafer temperature may be controlled or held at a desired temperature under a given RF heat load on the wafer 110 using a temperature feedback control loop governing either (or both) the expansion valve 210 and the bypass valve 212, although the simplest implementation controls the expansion valve 210 only. The actual temperature is sensed at a temperature probe, which may be a temperature probe 220 in the ESC insulating layer 10, a temperature probe 221 in the ESC base 05, a temperature probe 222 at the ESC evaporator inlet 201 or a temperature probe 223 at the ESC evaporator outlet 202 or a combination of any or all of these probes. For this purpose, a feedback control loop processor 224 governs the orifice opening size of the expansion valve 210 in response to input or inputs from one or more of the temperature probes. The processor 224 is furnished with a user-selected desired temperature value, which may be stored in a memory or user interface 225. As a simplified explanation, during each successive processing cycle, the processor 224 compares the current temperature measured by at least one of the probes (e.g., by the probe 220 in the ESC insulating layer) against the desired temperature value. The processor 224 then computes an error value as the difference between the desired and measured temperature values, and determines from the error a correction to the orifice size of either the bypass valve 212 or the expansion valve 210, that is likely to reduce the error. The processor 224 then causes the valve orifice size to change in accordance with the correction. This cycle is repeated during the entire duration of a wafer process to control the wafer temperature.

Agile Wafer Temperature Feedback Control Loop:

In conventional reactors, the wafer is cooled to avoid overheating from absorbed RF power by cooling the electrostatic chuck or wafer support pedestal. Thermal conductivity between the wafer 110 and the cooled ESC 105 is enhanced by injection under pressure of a thermally conductive gas (such as helium) into the interface between the backside of the wafer 110 and the top surface of the ESC 105, a technique well-known in the art. For this purpose, gas channels 226 are formed in the top surface of the ESC insulating layer 20 and a pressurized helium supply 228 is coupled to the internal ESC gas channels 226 through a backside gas pressure valve 229. The wafer 110 is electrostatically clamped down onto the top surface of the insulating layer 20 by a D.C. clamping voltage applied by a clamp voltage source 128 to the grid electrode 15. The thermal conductivity between the wafer 110 and the ESC top layer 20 is determined by the clamping voltage and by the thermally conductive gas (helium) pressure on the wafer backside. Highly agile (quick) wafer temperature control is carried out in accordance with the present invention by varying the backside gas pressure (by controlling the valve 229) so as to adjust the wafer temperature to the desired level. As the backside gas pressure is changed, the thermal conductivity between the wafer and the ESC top layer 20 is changed, which changes the balance between (a) the heat absorbed by the wafer 110 from RF power applied to the grid electrode 15 or coupled to the plasma and (b) the heat drawn from the wafer to the cooled ESC. Changing this balance necessarily changes the wafer temperature. A feedback control loop governing the backside gas pressure can therefore be employed for agile or highly responsive control of the wafer temperature. The response of the wafer temperature to changes in the backside gas pressure is extremely quick (temperature changes reaching equilibrium within a second or less). By way of comparison, changing the temperature of the base of the ESC or wafer support pedestal 105 does not cause the wafer to reach a new (elevated or depressed) equilibrium or steady state wafer temperature for on the order of minute (depending upon the thermal mass of the ESC 105). Therefore, a temperature regulation system employing the backside gas pressure provides agile temperature control capable of making fast adjustments to wafer temperature.

FIG. 7 illustrates such an agile temperature feedback control system, in which a feedback control loop processor 230 governs the backside gas pressure valve 229. One (or more) of the temperature sensors 220, 221, 222 or 223 in the ESC may be connected to an input of the processor 230. A user interface or memory 231 may provide a user-selected or desired temperature to the processor 230. During each successive processing cycle, the processor 230 computes an error signal as the difference between the current temperature measurement (from one of the sensors 220, 221, 222) and the desired temperature. The processor 230 determines from that difference a correction to the current setting of the backside gas pressure valve that would tend to reduce the temperature error, and changes the valve opening in accordance with that correction. For example, a wafer temperature that is deviating above the desired temperature would require increasing the backside gas pressure to increase thermal conductivity to the cooled ESC and bring down the wafer temperature. The converse is true in the case of a wafer temperature deviating below the desired temperature. The wafer temperature can thus be controlled and set to new temperatures virtually instantly within a temperature range whose lower limit corresponds to the chilled temperature of the ESC and whose upper limit is determined by the RF heat load on the wafer. For example, the wafer temperature cannot be increased in the absence of an RF heat load and the wafer temperature cannot be cooled below the temperature of the ESC. If this temperature range is sufficient, then any conventional technique may be used to maintain the ESC at a desired chilled temperature to facilitate the agile temperature feedback control loop governing the backside gas pressure.

Dual Temperature Feedback Control Loops:

The agile temperature feedback control loop governing the backside gas pressure valve 229 and the large range temperature feedback control loop governing the refrigeration expansion valve 210 may be operated simultaneously in a cooperative combination under the control of a master processor 232 controlling both feedback control loop processors 224, 230.

The large range temperature feedback control loop (involving the PCHT loop consisting of the evaporator 200, the compressor 206, the condenser 208 and the expansion valve 210) controls the workpiece temperature by changing the temperature of the electrostatic chuck 105. The temperature range is limited only by the thermal capacity of the PCHT loop and can therefore set the workpiece temperature to any temperature within a very large range (e.g., −10 deg C. to +150 deg C.). However, the rate at which it can effect a desired change in workpiece temperature at a particular moment is limited by the thermal mass of the electrostatic chuck 105. This rate is so slow that, for example, with an electrostatic chuck for supporting a 300 mm workpiece or silicon wafer, a 10 degree C. change in workpiece temperature can require on the order of a minute or more from the time the refrigeration unit begins to change the thermal conditions of the coolant to meet the new temperature until the workpiece temperature finally reaches the new temperature.

In contrast, in making a desired change or correction in workpiece temperature, the agile temperature feedback control loop does not change the electrostatic chuck temperature (at least not directly) but merely changes the thermal conductivity between the workpiece and the electrostatic chuck. The rate at which the workpiece temperature responds to such a change is extremely high because it is limited only by the rate at which the backside gas pressure can be changed and the thermal mass of the workpiece. The backside gas pressure responds to movement of the valve 229 in a small fraction of a second in a typical system. For a typical 300 mm silicon wafer, the thermal mass is so low that the wafer (workpiece) temperature responds to changes in the backside gas pressure within a matter of a few seconds or a fraction of a second. Therefore, relative to the time scale over which the large range temperature control loop effects changes in workpiece temperature, the workpiece temperature response of agile feedback loop is comparatively instantaneous. However, the range over which the agile feedback loop can change the workpiece temperature is quite limited: the highest workpiece temperature that can be attained is limited by the RF heat load on the wafer, while the lowest temperature cannot be below the current temperature of the electrostatic chuck 105. However, in combining the agile and large range temperature control loops together, the advantages of each one compensate for the limitations of the other, because their combination provides a large workpiece temperature range and a very fast response.

Figure 10:
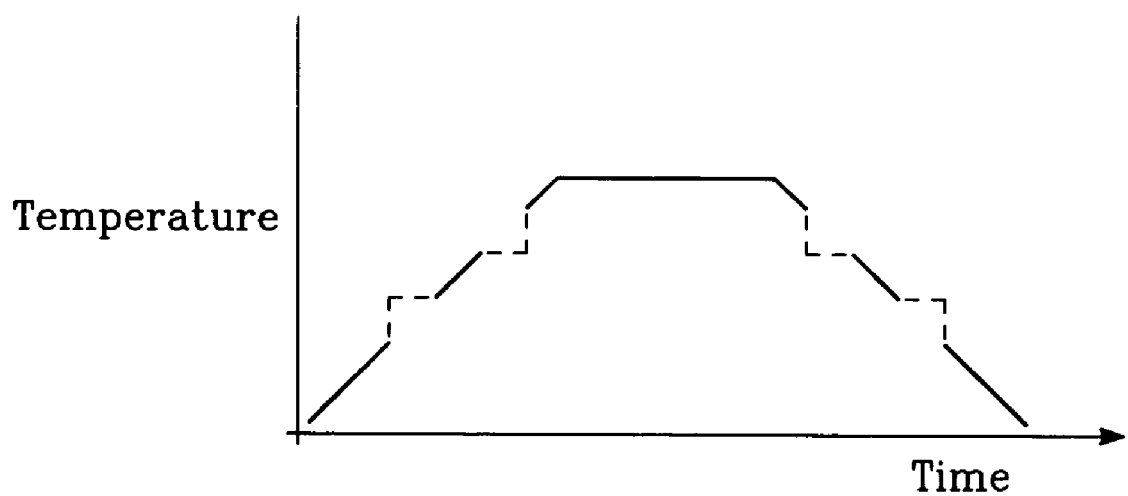
FIG. 10 depicts an exemplary wafer temperature-time profile that may be realized using the invention.

The master processor 232 may be programmed to effect large temperature changes using the large range feedback control loop (the processor 224) and effect quick but smaller temperature changes using the agile feedback control loop (the processor 230). FIG. 10 is a graph of one example of wafer temperature behavior over time. The solid line depicts the long term temperature behavior, in which the master processor 232 effects slow large changes in wafer temperature using the large range feedback control loop with the processor 224. The dashed line depicts fast perturbations in temperature, in which the master processor 232 effects fast but small changes in wafer temperature using the agile feedback control loop with the processor 230.

Figure 11A:
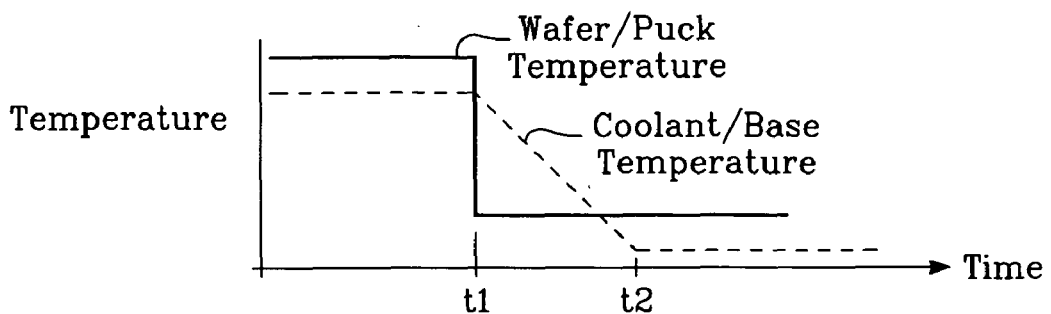
FIGS. 11A and 11B are contemporary timing diagrams of the wafer temperature and wafer backside gas pressure, respectively, in accordance with a process for stepping the wafer temperature down in advance of a corresponding ESC temperature change.
Figure 11B:
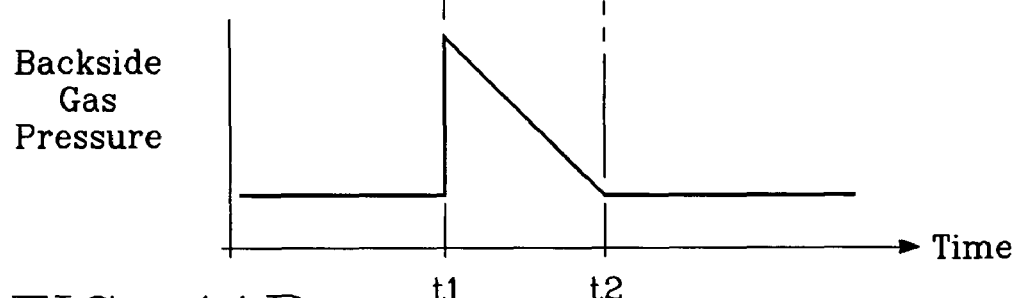

The dual loop control afforded by the master processor 232 can be employed to (nearly) instantly move the wafer temperature to a new desired level and hold it there while the ESC temperature slowly changes to the new desired temperature. This is illustrated in FIGS. 11A and 11B. The solid line in FIG. 11A depicts the wafer temperature behavior over time in which the wafer temperature is stepped down to a lower temperature at time t1 and held there, at which time the PCHT loop (dashed line) begins to cool down the ESC to the lower temperature, which is not reached by the ESC until time t2. The fast change in wafer temperature at time t1 and its temperature stability thereafter is accomplished by the agile control loop 230. The agile control loop processor 230 receives the new (lower) desired wafer temperature at time t1 and responds by immediately increasing the backside gas pressure (FIG. 11B) to step the wafer temperature down to the new temperature at time t1. In the meantime, the ESC temperature begins to fall in order to drive the ESC to (or slightly below) the new temperature at time t1, so that processor 224 increases the refrigeration cooling rate of the ESC to drive its temperature down. This forces the agile control loop processor 230 to decrease backside gas pressure after time t1 to maintain the desired wafer temperature, until the ESC reaches the correct temperature at time t2, after which the backside gas pressure remains constant.

Figure 12A:
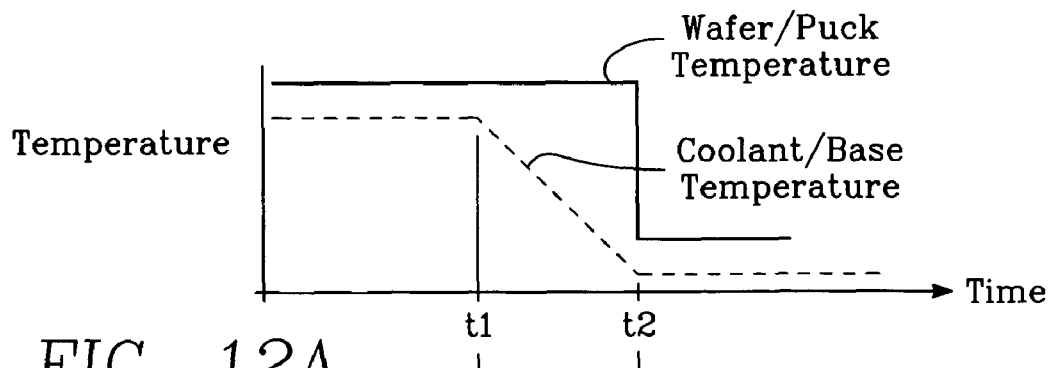
FIGS. 12A and 12B are contemporary timing diagrams of the wafer temperature and wafer backside gas pressure, respectively, in accordance with a process for stepping the wafer temperature down after completion of a corresponding ESC temperature change.
Figure 12B:
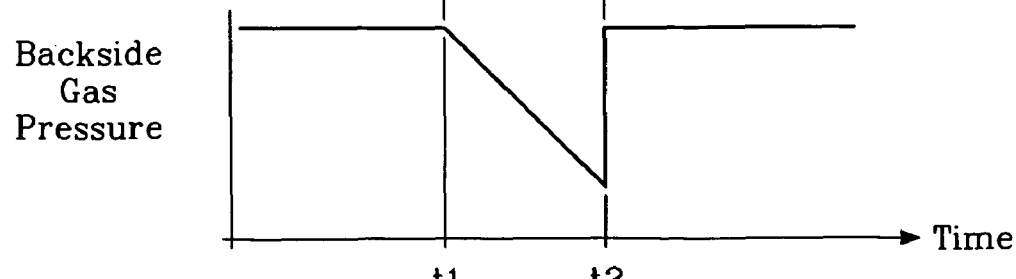

The example of FIGS. 12A and 12B illustrates how the ESC temperature change may be delayed while the PCHT loop is allowed to slowly adjust to a new temperature (to accommodate a time lag to the ESC surface of about 50 degrees over 5 seconds). FIG. 12A depicts temperature behavior over time while FIG. 12B depicts the corresponding backside gas pressure profile over time. As illustrated in FIGS. 12A and 12B, the dual loop control afforded by the master processor 232 can be employed to temporarily hold the wafer temperature constant (solid line of FIG. 12A) at an initial temperature level while, beginning at time t1, the PCHT loop takes the ESC through a large but slow temperature excursion (dashed line of FIG. 12A). Then, the wafer temperature is allowed to step down to the new ESC temperature. This is accomplished by cooling the ESC while constantly decreasing the backside gas pressure beginning at time t1. Then, after the desired ESC temperature is reached at time t2, the agile temperature control loop steps up the backside gas pressure to step the wafer temperature down to the ESC temperature.

Figure 13:
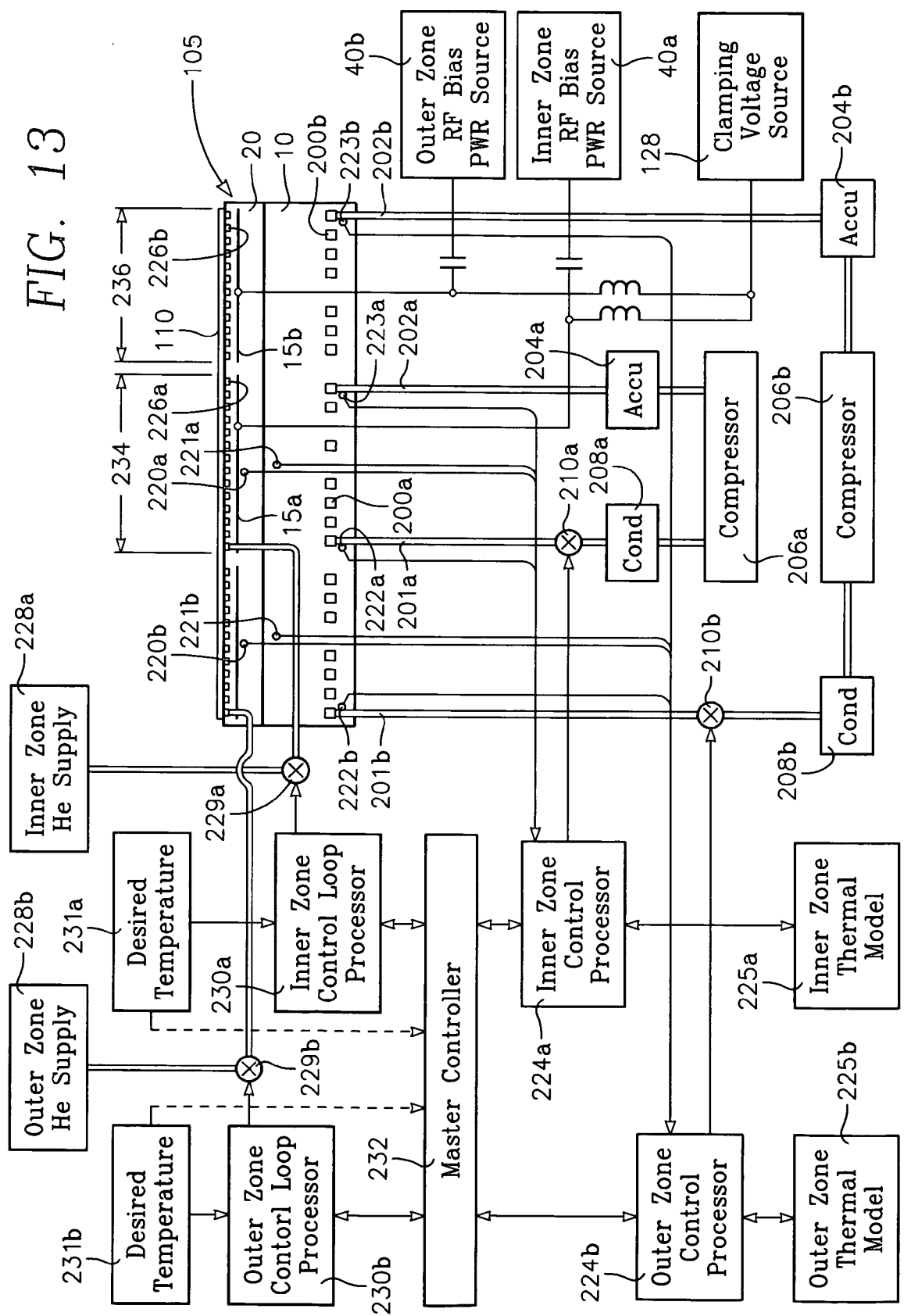
FIG. 13 illustrates a system similar to that of FIG. 7 but having multiple temperature control loops governing respectively multiple temperature zones.

Multiple Temperature Zones:

1. Large Range Temperature Control Loop:

The ESC 105 may be divided into plural radial zones, and different independent feedback control loops may separately control the temperature in each zone. An advantage of this feature is that different radial zones of the wafer 110 may be kept at different temperatures during processing so as to further reduce process or etch rate distribution non-uniformities. In the example of FIG. 13, the ESC 105 is divided into two temperature control zones, namely a radially inner zone 234 and a radially outer zone 236, and a separate temperature control apparatus is provided for each zone 234, 236. In some embodiments having such plural radial zones, it may be preferable to divide the ESC conductive mesh or electrode 15 into plural radial zones (such as concentric inner and outer zones 15a, 15b, for example).

The radially inner zone 234 of the aluminum base 05 contains inner zone coolant flow passages 200a with a coolant inlet 201a and a coolant outlet 202a. The inner zone coolant flow passages 200a constitute the inner zone evaporator of an inner zone PCHT loop, the evaporator 200a being internally contained with the inner zone 234 of the ESC base 05. The remaining elements of the inner zone PCHT loop are external of the ESC 105, and include (in order of coolant flow direction, starting from the coolant outlet 202a) an accumulator 204a, a compressor 206a, a condenser 208a and an expansion valve 210a having a variable orifice size, all of which are of the type well-known in the art. The radially outer zone 236 of the aluminum base 05 contains outer zone coolant flow passages 200b with a coolant inlet 201b and a coolant outlet 202b. The outer zone coolant flow passages 200b constitute the outer zone evaporator of an outer zone PCHT loop, the evaporator 200b being internally contained with the outer zone 236 of the ESC base 05. The remaining elements of the outer zone PCHT loop are external of the ESC 105, and include (in order of coolant flow direction, starting from the coolant outlet 202b) an accumulator 204b, a compressor 206b, a condenser 208b and an expansion valve 210b having a variable orifice size, all of which are of the type well-known in the art. Temperature in the inner zone 234 is sensed at one or more of the following inner zone temperature probes: probe 220a in the inner zone 234 of the ESC insulating layer 10, probe 221a in the inner zone of the ESC base 05, probe 222a at the inner zone evaporator inlet 201a or probe 223a at the inner zone evaporator outlet 202a.

An inner zone feedback control loop processor 224a governs the orifice opening size of the inner zone expansion valve 210a in response to input or inputs from one or more of the inner zone temperature probes. The inner zone processor 224a is furnished with a user-selected desired inner zone temperature value, which may be stored in a memory or user interface 225a. During each successive processing cycle, the inner zone processor 224a compares the current temperature measured by at least one of the probes (e.g., the probe 220a in the ESC insulating layer) against the desired temperature value and corrects the orifice size of the inner zone expansion valve 210a accordingly. An outer zone feedback control loop processor 224b governs the orifice opening size of the outer zone expansion valve 210b in response to input or inputs from one or more of the outer zone temperature probes. The outer zone processor 224b is furnished with a user-selected desired outer zone temperature value, which may be stored in a memory or user interface 225b. During each successive processing cycle, the outer zone processor 224b compares the current temperature measured by at least one of the probes (e.g., the outer zone probe 220b in the ESC insulating layer) against the desired temperature value and corrects the orifice size of the outer zone expansion valve 210b accordingly.

2. Agile Temperature Feedback Control Loop:

In both temperature zones 234 and 236, thermal conductivity between the wafer 110 and the cooled ESC 105 is enhanced by injection under pressure of a thermally conductive gas (such as helium) into the interface between the backside of the wafer 110 and the top surface of the ESC 105, a technique well-known in the art. In the inner temperature zone 234, inner zone gas channels 226a are formed in inner zone 234 of the top surface of the ESC insulating layer 20 and a pressurized helium supply 228a is coupled to the inner zone gas channels 226a through an inner zone backside gas pressure valve 229a. The wafer 110 is electrostatically clamped down onto the top surface of the insulating layer 20 by a D.C. clamping voltage applied by a clamp voltage source 128 to the grid electrode 15 (i.e., 15a and 15b). The thermal conductivity between the wafer 110 and the ESC top layer 20 is determined by the clamping voltage and by the thermally conductive gas (helium) pressure on the wafer backside. Highly agile (quick) wafer temperature control is carried out in the inner temperature zone 234 by controlling the inner zone valve 229a so as to adjust the wafer temperature to the desired level. An inner zone agile feedback control loop processor 230a governs the inner zone backside gas pressure valve 229a. One (or more) of the inner zone temperature sensors 220a, 221a, 222a or 223a in the ESC inner zone 234 may be connected to an input of the inner zone agile processor 230a. An inner zone user interface or memory 231a may provide a user-selected or desired temperature to the inner zone agile processor 230a. During each successive processing cycle, the processor 230a senses an error as the difference between the current temperature measurement (from one of the inner zone sensors 220a, 221a, 222a) and the desired temperature, and changes the opening of the inner zone backside gas valve 229a accordingly.

In the outer temperature zone 236, outer zone gas channels 226b are formed in outer zone 236 of the top surface of the ESC insulating layer 20 and the pressurized helium supply 228b is coupled to the outer zone gas channels 226b through an outer zone backside gas pressure valve 229b. Highly agile (quick) wafer temperature control is carried out in the outer temperature zone 236 by controlling the outer zone valve 229b so as to adjust the wafer temperature to the desired level. An outer zone agile feedback control loop processor 230b governs the outer zone backside gas pressure valve 229b. One (or more) of the outer zone temperature sensors 220b, 221b, 222b or 223b in the ESC outer zone 236 may be connected to an input of the outer zone agile processor 230b. An outer zone user interface or memory 231b may provide a user-selected or desired temperature to the inner zone agile processor 230b. During each successive processing cycle, the processor 230b senses an error as the difference between the current temperature measurement (from one of the outer zone sensors 220b, 221b, 222b) and the desired temperature, and changes the opening of the outer zone backside gas valve 229b accordingly.

With the combination of the agile and large range inner and outer feedback control loops described above with reference to FIG. 13, the radial profile of the wafer temperature may be controlled over a large range with agile response.

Figure 14:
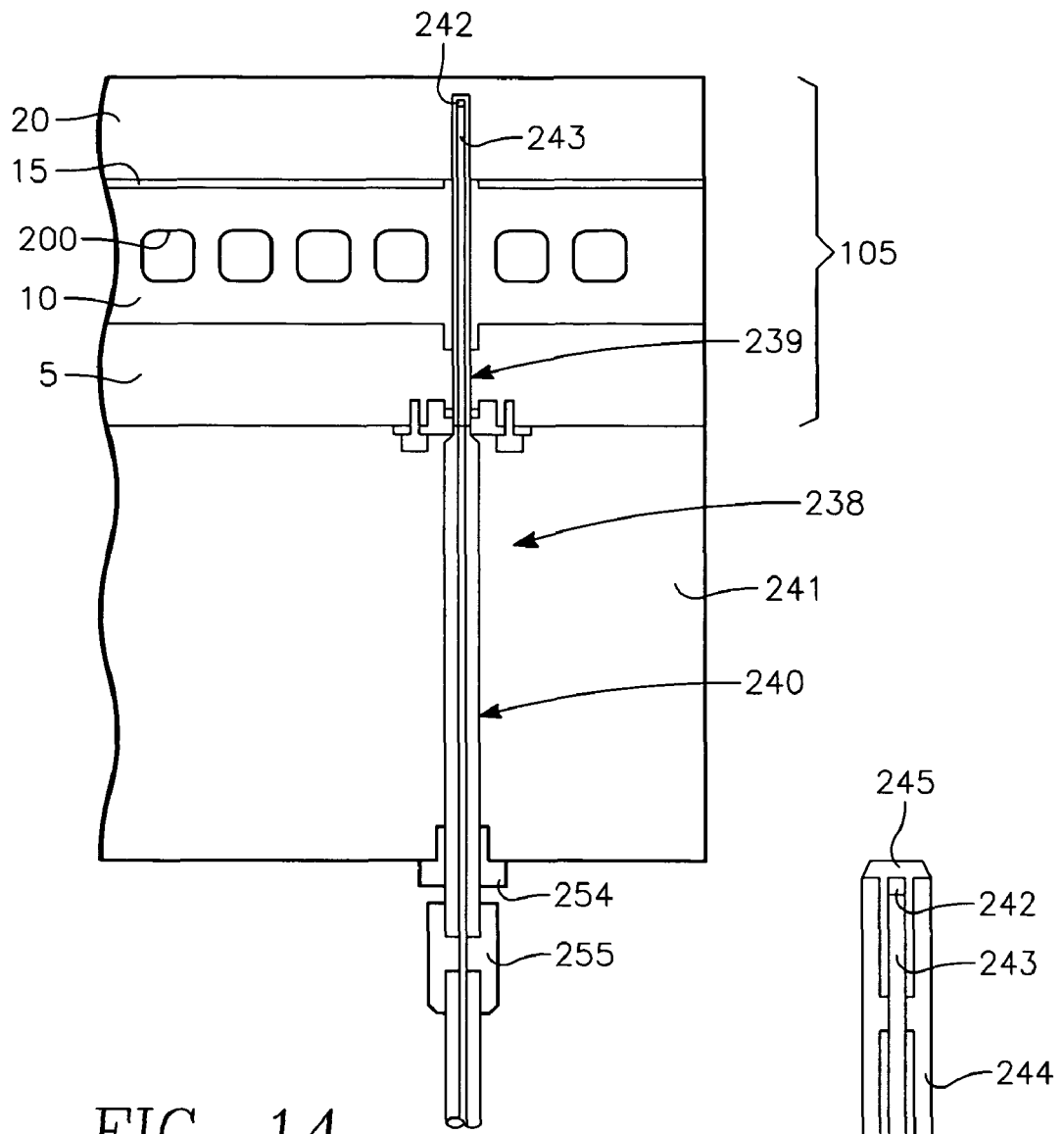
FIG. 14 illustrates an optical temperature sensor of the invention as installed in the ESC of FIG. 7 or FIG. 13.
Figure 15:
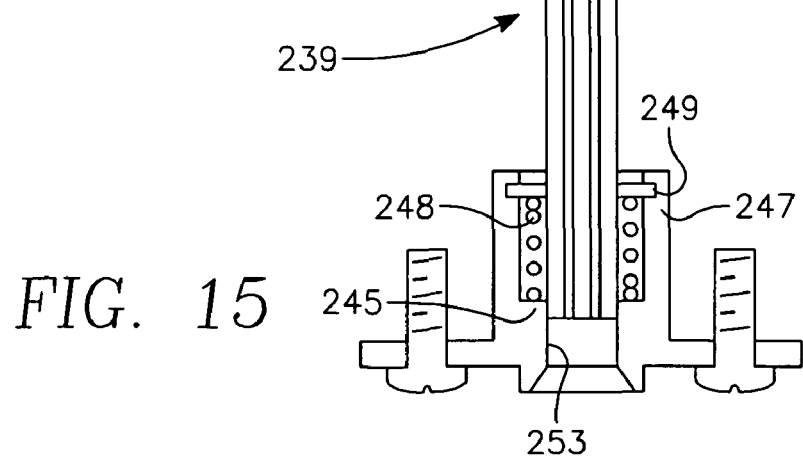
FIG. 15 illustrates an upper probe of the temperature sensor of FIG. 14.

Temperature Probe with Minimal or No RF Parasitics:

FIG. 14 depicts a preferred temperature probe 238 installed in the plasma reactor of FIG. 1. The probe 238 consists of two separable portions, namely an upper probe 239 installed in the ESC 105 and a lower probe 240 installed in a portion of the reactor chamber beneath and supporting the ESC 105, namely a chamber host base 241. The upper probe 239 is depicted in the enlarged view of FIG. 15, and lies in an area of high RF electric potential (i.e., inside the ESC insulating layer or puck 10, 20). The upper probe 239 is firmly inserted in an elongate axial hole within the ESC 105 that closely fits the upper probe 239, and the tip of the upper probe 239 lies very close (e.g., within 3 to 3.5 mm) to the top surface of the puck 20. (The advantage is that the probe 239 is sufficiently close to the wafer 110 to minimize or eliminate temperature measurement errors.) This area of the ESC has very high electric field potential during processing so that any electrical properties that the upper probe 239 may have would have profound effects on plasma processing on the wafer. The upper probe 239 therefore includes RF compatibility features which minimize or eliminate any effect that the probe 239 might otherwise have on the electric field or on the RF impedance distribution. Such RF compatibility features ensure that the probe 239 does not distort or perturb the ESC electric field or RF impedance distribution that has been so carefully adjusted with the features of the feedpoint impedance adjustment of FIGS. 2-4 and/or the dielectric ring process kit of FIGS. 5-6 (for example). The RF compatibility features of the upper probe 239 include a complete absence of any conductive materials within the probe 239, an orientation of the probe in the axial direction (to minimize its effect on the radial electric field or RF impedance distribution) and its small diameter, which is on the order of a fraction of a Debeye length of the plasma in the chamber. These features are made possible by employing an electrically nonconductive optical temperature transducer 242 (e.g., a phosphor material) whose blackbody radiation spectrum is a well-known function of its temperature. The optical temperature transducer 242 is coupled to a long thin optical fiber 243 contained within the thin axial upper probe 239. The upper probe 239 further includes an opaque cylindrical dielectric sleeve 244 surrounding the optical fiber 243 and preferably consisting of glass-impregnated plastic. The optical temperature transducer 242 is capped by a dielectric cap 245 of a material that is, preferably, identical to the dielectric material of the ESC puck 10, 20, which in the preferred embodiment is aluminum nitride. This latter feature ensures that the temperature behavior of the material contacting the optical temperature transducer 242 (i.e., the cap 245) is identical to the material whose temperature is to be measured (i.e., the ESC puck layer 20 that is in direct contact with the wafer 110).

The upper probe 239 further includes a mounting plate 246 that is removably fastened to the bottom surface of the ESC base 05. The mounting plate 246 supports a spring housing 247 containing a coil spring 248 compressed between a shoulder 245 of the housing 247 and an annular ring 249 fastened to a portion of the probe sleeve 244 lying within the housing 247. As the upper probe 239 is inserted into the ESC 105 and presses against the top end of the hole within the ESC, the coil spring 248 is compressed to force the tip of the probe 239 to self-align to the top end of the hole.

Figure 16:
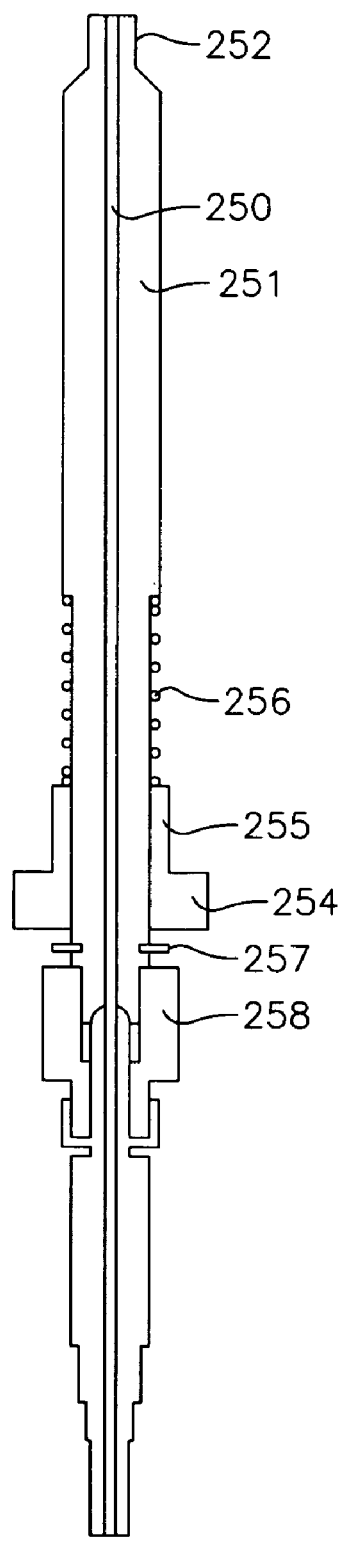
FIG. 16 illustrates a lower probe of the temperature sensor of FIG. 14.
Figure 17:
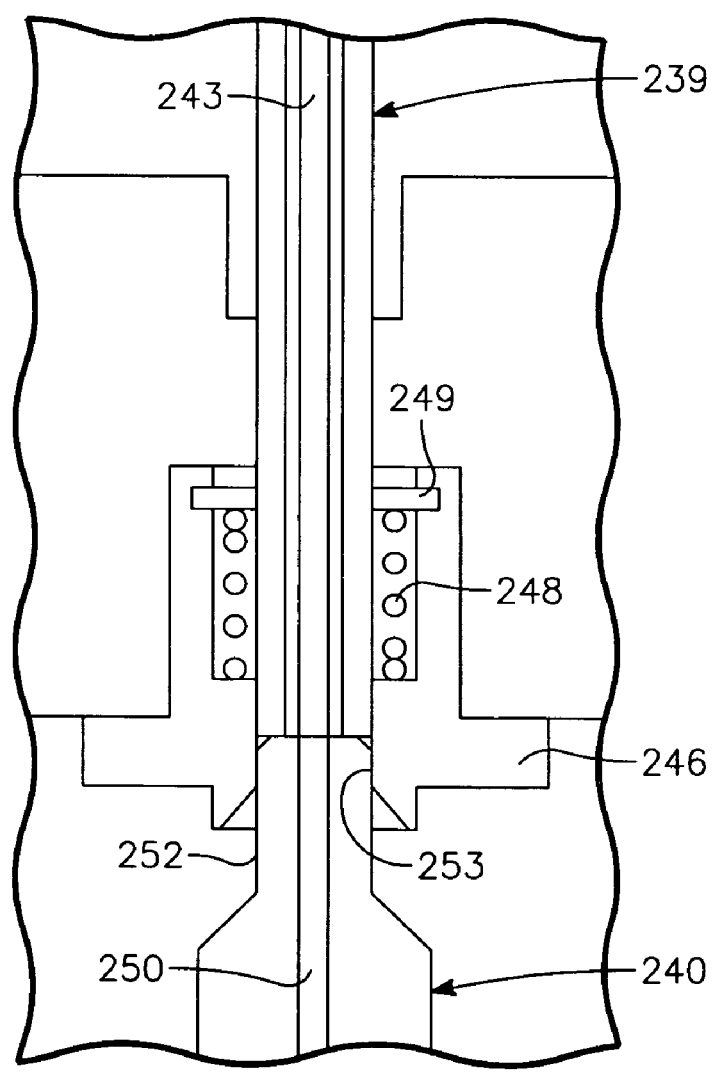
FIG. 17 is an enlarged view of a portion of FIG. 14 showing how the upper and lower probes are joined together within the ESC.

The lower probe 240 is shown in the enlarged view of FIG. 16 and includes an optical fiber 250 surrounded by an opaque lower cylindrical sleeve 251. Since the lower probe 240 is below the grounded conductive ESC base 05, it is located outside of areas of high RF electric fields, and therefore need not be formed of non-conductive materials. In fact, the lower cylindrical sleeve 251 may be formed of steel, for example. The top end 252 of the lower probe 240 is tightly received within a hole 253 in the mounting plate 246 of the upper probe 239. The lower probe 240 further includes a mounting plate 254 that is removably fastened to the bottom surface of the chamber housing host base 241. The mounting plate 254 supports a spring housing 255 containing a coil spring 256 compressed between a shoulder 257 of the housing 255 and an annular ring 258 fastened to a portion of the lower probe sleeve 251 lying within the housing 255. As the tip 252 of the lower probe 240 is inserted into the hole 253 of the upper probe mounting plate 246 and pressed against the top end of the hole 253, the coil spring 256 is compressed to force the tip of the lower probe 240 to self-align to the top end of the hole 253. The resulting self-alignment of the lower probe 240 against the upper probe 239 is illustrated in FIG. 17, which shows that the facing ends of the upper probe optical fiber 243 and the lower probe optical fiber 250 are in nearly perfect alignment. Signal conditioning circuitry converts the light received from the optical fiber at the bottom end of the lower probe fiber 250 and converts it to a digital signal for use by one of the feedback control loop processors. While FIG. 14 depicts a single temperature probe whose tip lies near the top of the ESC 105, another identical probe may be placed in a lower portion of the ESC but at the same radial location as first probe. Other identical probes may be placed at different radial (azimuthal) locations within the ESC but in the same height (axial location) as other probes. Thus, the temperature probes 220a, 220b of the different temperature zones 234, 236 of FIG. 13 may each be of the type described above in FIGS. 13-16 and are located at different radial locations at a common axial height.

While certain embodiments of the invention have been described as including different feedback control loop processors, any or all such processors may be implemented in a single common processor programmed to perform the functions of each of the individual feedback control loop processors. Similarly, other resources associated with the different control loops, such as the dual helium supplies 228a, 228b, may be implemented with a single supply or resource with separately controlled interfaces (e.g., such as a single helium supply and dual pressure control valves 229a, 229b). Moreover, if (for example) the conductive mesh electrode 15 is divided into inner and outer electrodes 15a, 15b as suggested earlier in this specification, then a common RF bias power source may be employed to apply different levels of RF bias power to the inner and outer mesh electrodes 15a, 15b. Alternatively, separate RF bias power generators may be employed to realize the separate RF bias power levels.

While the invention has been described in detail by specific reference to preferred embodiments, it is understood that variations and modifications thereof may be made without departing from the true spirit and scope of the invention.

What is claimed is:

1. A method of controlling the temperature of a workpiece supported on a top surface of a workpiece support in an RF coupled plasma reactor, comprising:
   placing coolant in a flow channel that is thermally coupled to said workpiece support;
   supplying a thermally conductive gas between the backside of said workpiece and the workpiece support top surface to establish a backside gas pressure;
   providing a first temperature sensor thermally coupled to said workpiece support and a second temperature sensor thermally coupled to said workpiece;
   determining whether a change in thermal condition of said workpiece is a first type of change having a first rate of change not exceeding a rate limited by a thermal mass of said workpiece support or a second type of change having a second rate of change exceeding said first rate of change;
   causing or responding to said first type of change in thermal condition of said workpiece by monitoring a temperature of said workpiece support through said first temperature sensor, and changing the thermal conditions of said coolant in said flow channel so as to reduce a difference between the output of said first temperature sensor and a target workpiece support temperature;
   causing or responding to said second type of change in thermal condition of said workpiece by monitoring the temperature of said workpiece through said second temperature sensor, and changing the pressure of said thermally conductive gas so as to reduce a difference between the output of said second temperature sensor and a target workpiece temperature.

2. The method of claim 1 wherein:
   said second type of change in thermal conditions corresponds to a change in workpiece temperature lying in a range limited by an RF heat load on the workpiece and a present temperature of said workpiece support;
   said first type of change in thermal conditions corresponds to a change in workpiece temperature exceeding said range.

3. The method of claim 2 wherein:
   said target workpiece support temperature corresponds to said first type of change in thermal condition of said workpiece;
   said target workpiece temperature corresponds to said second type of change in thermal condition of said workpiece.

4. In an RF coupled plasma reactor, a method of transferring heat between a workpiece support and a workpiece supported on a top surface of the workpiece support with an at least nearly uniform temperature across the workpiece support, comprising:
   placing coolant in a flow channel that is thermally coupled to said workpiece support;
   coupling RF power into a processing zone of said reactor;
   supplying a thermally conductive gas between the backside of said workpiece and the workpiece support top surface to establish a backside gas pressure;
   providing a first temperature sensor thermally coupled to said workpiece support and a second temperature sensor thermally coupled to said workpiece;
   determining whether a change in RF heat load on the workpiece is one change in RF heat load having a first rate of change not exceeding a rate limited by a thermal mass of said workpiece support or an other change in RF heat load having a second rate of change exceeding said first rate of change;
   responding to said one change in RF heat load on said workpiece by monitoring a temperature of said workpiece support through said first temperature sensor, and changing the thermal conditions of said coolant in said flow channel so as to reduce a difference between the output of said first temperature sensor and a target workpiece support temperature;
   responding to said other change in RF heat load on said workpiece by monitoring the temperature of said workpiece through said second temperature sensor, and changing the pressure of said thermally conductive gas so as to reduce a difference between the output of said second temperature sensor and a target workpiece temperature.

5. The method of claim 4 wherein:
   the other change in RF heat load on the workpiece corresponds to a change in workpiece temperature lying in a range limited by an RF heat load on the workpiece and a current temperature of said workpiece support;
   the one change in RF heat load on the workpiece corresponds to a change in workpiece temperature exceeding said range.

6. The method of claim 5 wherein:
   said target workpiece support temperature is determined in accordance with said one change in RF heat load on said workpiece;
   said target workpiece temperature is determined in accordance with the other change in RF heat load on said workpiece.

* * * * *